(12) United States Patent
Yamaguchi et al.

(10) Patent No.: US 11,869,799 B2
(45) Date of Patent: Jan. 9, 2024

(54) TEMPERATURE ADJUSTMENT SYSTEM

(71) Applicant: Tokyo Electron Limited, Tokyo (JP)

(72) Inventors: Shin Yamaguchi, Miyagi (JP);
Akiyoshi Mitsumori, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 478 days.

(21) Appl. No.: 17/273,413

(22) PCT Filed: Sep. 5, 2019

(86) PCT No.: PCT/JP2019/035063
§ 371 (c)(1),
(2) Date: Mar. 4, 2021

(87) PCT Pub. No.: WO2020/050375
PCT Pub. Date: Mar. 12, 2020

(65) Prior Publication Data
US 2021/0327747 A1 Oct. 21, 2021

(30) Foreign Application Priority Data
Sep. 7, 2018 (JP) .................................. 2018-167847

(51) Int. Cl.
*H01L 21/687* (2006.01)
(52) U.S. Cl.
CPC .............................. *H01L 21/68785* (2013.01)
(58) Field of Classification Search
CPC ............................................... H01L 21/68785
See application file for complete search history.

(56) References Cited

U.S. PATENT DOCUMENTS

| 7,815,740 B2 * | 10/2010 | Oohashi | H01J 37/32724 118/724 |
| 2014/0004706 A1 * | 1/2014 | Miya | H01L 21/3065 156/345.37 |

FOREIGN PATENT DOCUMENTS

| JP | 2008-501927 A | 1/2008 |
| JP | 2008-509553 A | 3/2008 |

(Continued)

OTHER PUBLICATIONS

International Search Report for PCT/JP2019/035063 dated Nov. 19, 2019.

*Primary Examiner* — Schyler S Sanks
(74) *Attorney, Agent, or Firm* — Pearne & Gordon LLP

(57) ABSTRACT

A heat exchange unit performs heat exchange using a coolant and is disposed inside a placing table and equipped with heat exchange chambers. The heat exchange chambers are disposed in regions, respectively, set on the placing table. The regions are set along a placing surface of the placing table. A chiller device circulates the coolant with respect to the heat exchange chambers. A temperature detection device includes temperature detectors. The temperature detectors are disposed in the regions, respectively, between the respective heat exchange chambers and the placing surface. A control device controls the chiller device to adjust a pressure of the coolant such that a temperature of the placing table reaches a first temperature range, and controls the chiller device to individually adjust flow rates of the coolant supplied to the heat exchange chambers, respectively, such that all of temperatures measured by the temperature detectors reach the first temperature range.

6 Claims, 13 Drawing Sheets

(56) References Cited

FOREIGN PATENT DOCUMENTS

| | | | |
|---|---|---|---|
| JP | 2011-501092 A | 1/2011 | |
| JP | 2011-119515 A | 6/2011 | |
| JP | 2012-069809 A | 4/2012 | |
| JP | 2014-011214 A | 1/2014 | |
| JP | 2016-012593 A | 1/2016 | |
| JP | 2018-125461 A | 8/2018 | |
| WO | 2005/121657 A2 | 12/2005 | |
| WO | WO-2005121657 A2 * | 12/2005 | ............. F25B 15/00 |
| WO | 2009/049096 A1 | 4/2009 | |

* cited by examiner

|      | FCV-1 | ... | FCV-n | TOTAL |
|------|-------|-----|-------|-------|
| T1   | 30%   | ... | 10%   | 100%  |
| T2   | 20%   | ... | 5%    | 100%  |
| ...  | ...   | ... | ...   | 100%  |

PT2 →

|      | FCV-1 | ... | FCV-n | TOTAL |
|------|-------|-----|-------|-------|
| T1   | 50%   | ... | 20%   | 100%  |
| ...  | 50%   | ... | 20%   | 100%  |

PT3 →

|      | FCV-1 | ... | FCV-n | TOTAL |
|------|-------|-----|-------|-------|
| T1   | 100%  | ... | 0%    | 100%  |
| T2   | 0%    | ... | 100%  | 100%  |
| ...  | ...   | ... | ...   | 100%  |

TEMPERATURE ADJUSTMENT SYSTEM

CROSS-REFERENCE TO RELATED APPLICATION

This Application is a U.S. national phase application under 35 U.S.C. § 371 of PCT Application No. PCT/JP2019/035063 filed on Sep. 5, 2019, which claims the benefit of Japanese Patent Application No. 2018-167847 filed on Sep. 7, 2018, the entire disclosures of which are incorporated herein by reference.

TECHNICAL FIELD

The various aspects and exemplary embodiments described herein pertain generally to a temperature adjustment system.

BACKGROUND

When processes such as deposition and etching are performed by a plasma processing apparatus or the like in a semiconductor manufacturing apparatus, a temperature of a target object is adjusted during the processes. For example, a heat control method and its system are disclosed in Patent Document 1 and Patent Document 2.
Patent Document 1: Published Japanese Translation of PCT Patent Application No. 2008-501927
Patent Document 2: Published Japanese Translation of PCT Patent Application No. 2011-501092

SUMMARY

In one exemplary embodiment, there is provided a temperature adjustment system. The temperature adjustment system includes a heat exchange unit; a chiller device; a heating device; a temperature detection device; and a control device. The heat exchange unit is configured to perform heat exchange using a coolant and is disposed inside a placing table, on which a target object is placed, and equipped with multiple heat exchange chambers. The multiple heat exchange chambers are disposed in multiple regions, respectively, set on the placing table. The multiple regions are set along a placing surface of the placing table. The chiller device is configured to circulate the coolant with respect to the multiple heat exchange chambers. The temperature detection device includes multiple temperature detectors. The multiple temperature detectors are disposed in the multiple regions, respectively, and disposed between the respective multiple heat exchange chambers and the placing surface. The control device is configured to control the chiller device to adjust a pressure of the coolant such that a temperature of the placing table reaches a first temperature range, and then, control the chiller device to individually adjust flow rates of the coolant supplied to the multiple heat exchange chambers, respectively, such that all of temperatures measured by the multiple temperature detectors reach the first temperature range.

BRIEF DESCRIPTION OF THE DRAWINGS

FIG. 9 is a diagram for illustratively describing an operation of the temperature adjustment system shown in FIG. 1.

DETAILED DESCRIPTION

Figure 1:
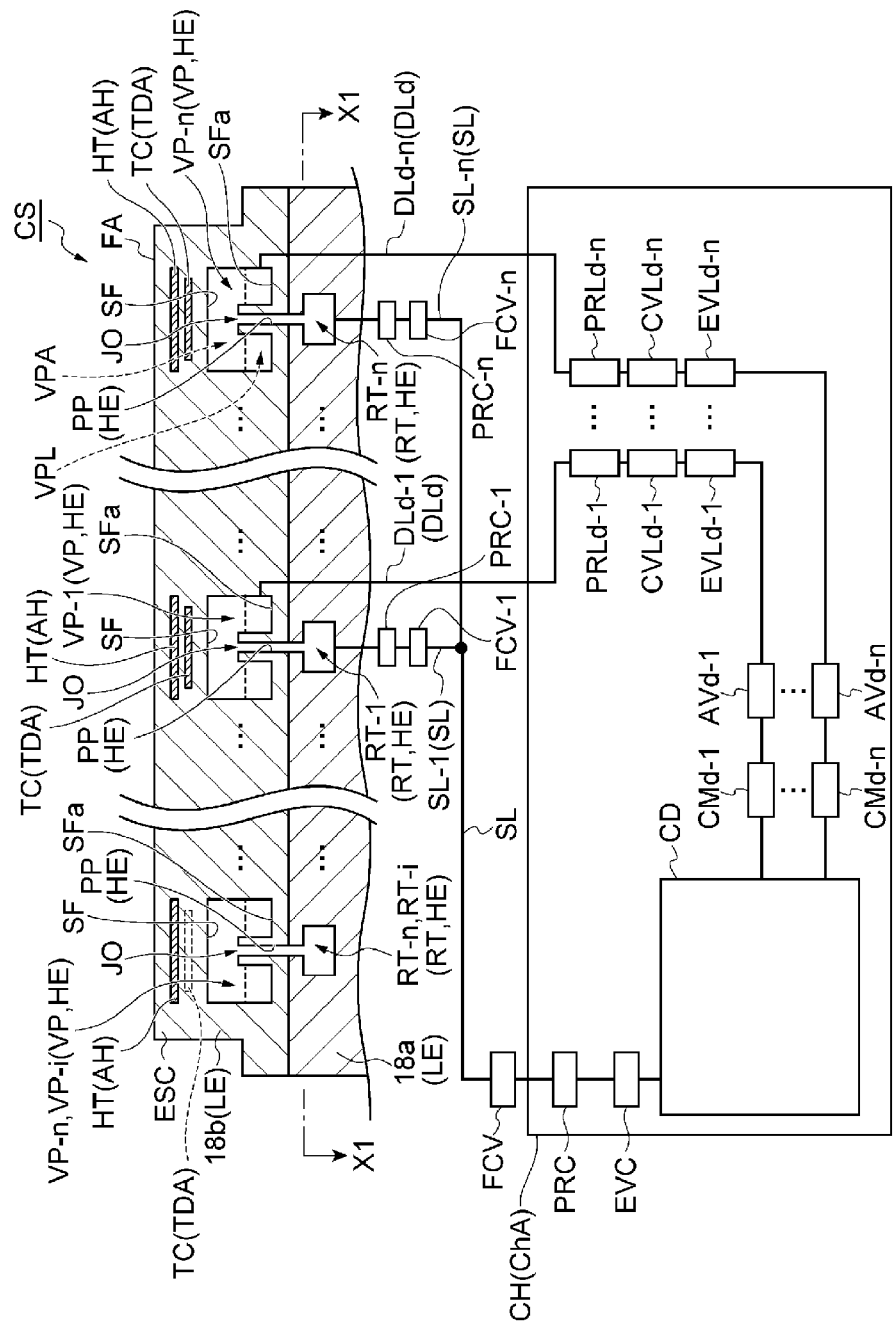
FIG. 1 is a diagram illustrating another configuration of a temperature adjustment system according to an exemplary embodiment of the present disclosure.

Description of Exemplary Embodiment of Present Disclosure

First, various exemplary embodiments of the present disclosure will be illustratively described. In one exemplary embodiment, a temperature adjustment system is provided. The temperature adjustment system includes a heat exchange unit; a chiller device; a heating device; a temperature detection device; and a control device. The heat exchange unit is configured to perform heat exchange using a coolant and is disposed inside a placing table, on which a target object is placed, and equipped with multiple heat exchange chambers. The multiple heat exchange chambers are disposed in multiple regions, respectively, set on the placing table. The multiple regions are set along a placing surface of the placing table. The chiller device is configured to circulate the coolant with respect to the multiple heat exchange chambers. The temperature detection device includes multiple temperature detectors. The multiple temperature detectors are disposed in the multiple regions, respectively, and disposed between the respective multiple heat exchange chambers and the placing surface. The control device is configured to control the chiller device to adjust a pressure of the coolant such that a temperature of the placing table reaches a first temperature range. Then, the control device is configured to control the chiller device to individually adjust flow rates of the coolant supplied to the multiple heat exchange chambers, respectively, such that all of temperatures measured by the multiple temperature detectors reach the first temperature range. As described above, first, the pressure of the coolant is adjusted over the entire placing table so that the temperature of the placing table is adjusted to the first temperature range. Thereafter, the flow rate of the coolant is individually adjusted for each region so that all the regions of the placing table have temperatures in the first temperature range. Therefore, the non-uniformity in the temperature of the placing table can be efficiently reduced.

In the exemplary embodiment, after all of the temperatures measured by the multiple temperature detectors reach the first temperature range, the control device controls the chiller device to adjust the pressure of the coolant such that the temperature of the placing table reaches a second temperature range different from the first temperature range. As described above, after the temperatures of all the regions of the placing table are adjusted to the first temperature range, the pressure of the coolant is adjusted, and, thus, the temperature of the placing table is adjusted to the second temperature range, which can be relatively easily achieved.

In the exemplary embodiment, the heating device includes multiple heaters. The multiple heaters are disposed in the multiple regions, respectively, and disposed between the respective multiple heat exchange chambers and the placing surface. When the pressure of the coolant is adjusted, the control device further performs, based on the temperatures measured by the temperature detectors, at least one of adjustment of heat generation amount from each of the multiple heaters by controlling each of the multiple heaters or adjustment of dryness fraction of the coolant by controlling the chiller device. As described above, when the pressure of the coolant is adjusted, for example, if the temperature of the placing table is increased, at least one of the dryness fraction of the coolant or the heat generation amount from the heaters is adjusted together with the pressure of the coolant. Accordingly, the temperature of the placing table can be increased more quickly.

In the exemplary embodiment, the heating device includes multiple heaters. The multiple heaters are disposed in the multiple regions, respectively, and disposed between the respective multiple heat exchange chambers and the placing surface. When the flow rates of the coolant are adjusted, the control device further adjusts heat generation amount from each heater by controlling the corresponding heater based on the temperatures measured by the temperature detectors. As described above, when the flow rate of the coolant is adjusted, for example, if the temperature of the placing table is increased, adjustment of the heat generation amount from the heater for each region is performed together with adjustment of the flow rate of the coolant for each region. Accordingly, the temperature of each region can be increased more accurately and quickly.

In the exemplary embodiment, the chiller device includes multiple chiller units, and the multiple chiller units circulate the coolant with respect to the multiple heat exchange chambers, respectively.

In the exemplary embodiment, the placing table is disposed inside a processing container of a plasma processing apparatus.

Details of Exemplary Embodiment of Present Disclosure

Hereinafter, various exemplary embodiments of the present disclosure will be explained with reference to the accompanying drawings. Further, the same or corresponding parts in each drawing are designated by the same reference signs.

A temperature adjustment system and a temperature adjustment method according to an exemplary embodiment will be described with reference to the accompanying drawings. A configuration of a temperature adjustment system CS according to an exemplary embodiment of the present disclosure is shown in FIG. 1. This temperature adjustment system CS can be used in a temperature adjustment system CS shown in FIG. 2 and a plasma processing apparatus 10 shown in FIG. 3.

First, configurations shown in each of FIG. 2 and FIG. 3 will be described. The temperature adjustment system CS shown in FIG. 2 includes a placing table PD, a supply line SL, a discharge line DLd, a gas line AL1 and a gas line AL2. The temperature adjustment system CS includes a heat exchange unit HE, a chiller device ChA, a heating device AH, a temperature detection device TDA and a control device Cnt.

The placing table PD has a placing surface FA and a wafer W is placed thereon. The wafer W is placed on the placing surface FA. The placing table PD includes the heat exchange unit HE, the heating device AH and the temperature detection device TDA.

The heat exchange unit HE includes a plurality of heat exchange chambers HR. The plurality of heat exchange chambers HR is disposed in a plurality of regions ER, respectively, set on the placing table PD. The heat exchange chamber HR corresponds to a configuration including a divided chamber VP-k and a divided chamber RT-k shown in each of FIG. 1, FIG. 10 and FIG. 12 (k is an integer of from 1 to n).

The placing table PD is divided into the plurality of regions ER. The plurality of regions ER is set along the placing surface FA of the placing table PD. The plurality of heat exchange chambers HR is disposed in the plurality of regions ER, respectively.

The heating device AH includes a plurality of heaters HT. The plurality of heaters HT is disposed in the plurality of regions ER, respectively. The plurality of heaters HT is disposed between the respective plurality of heat exchange chambers HR and the placing surface FA. Each heater HT extends along the placing surface FA in a region ER where the heater HT is disposed. The heater HT covers the region ER where the heater HT is disposed when viewed from above the placing surface FA.

The temperature detection device TDA includes a plurality of temperature detectors TC. The plurality of temperature detectors TC is disposed in the plurality of regions ER, respectively. The plurality of temperature detectors TC is disposed between the respective plurality of heat exchange chambers HR and the placing surface FA. For example, the plurality of temperature detectors TC may be disposed between the plurality of heat exchange chambers HR and the plurality of heaters HT, respectively.

The chiller device ChA includes a condensing device CD and a compressor CM. The chiller device ChA circulates a coolant with respect to the plurality of heat exchange chambers HR. The condensing device CD includes a condenser CDa, an expansion valve EV1 and a flow dividing valve EV2.

Figure 10:
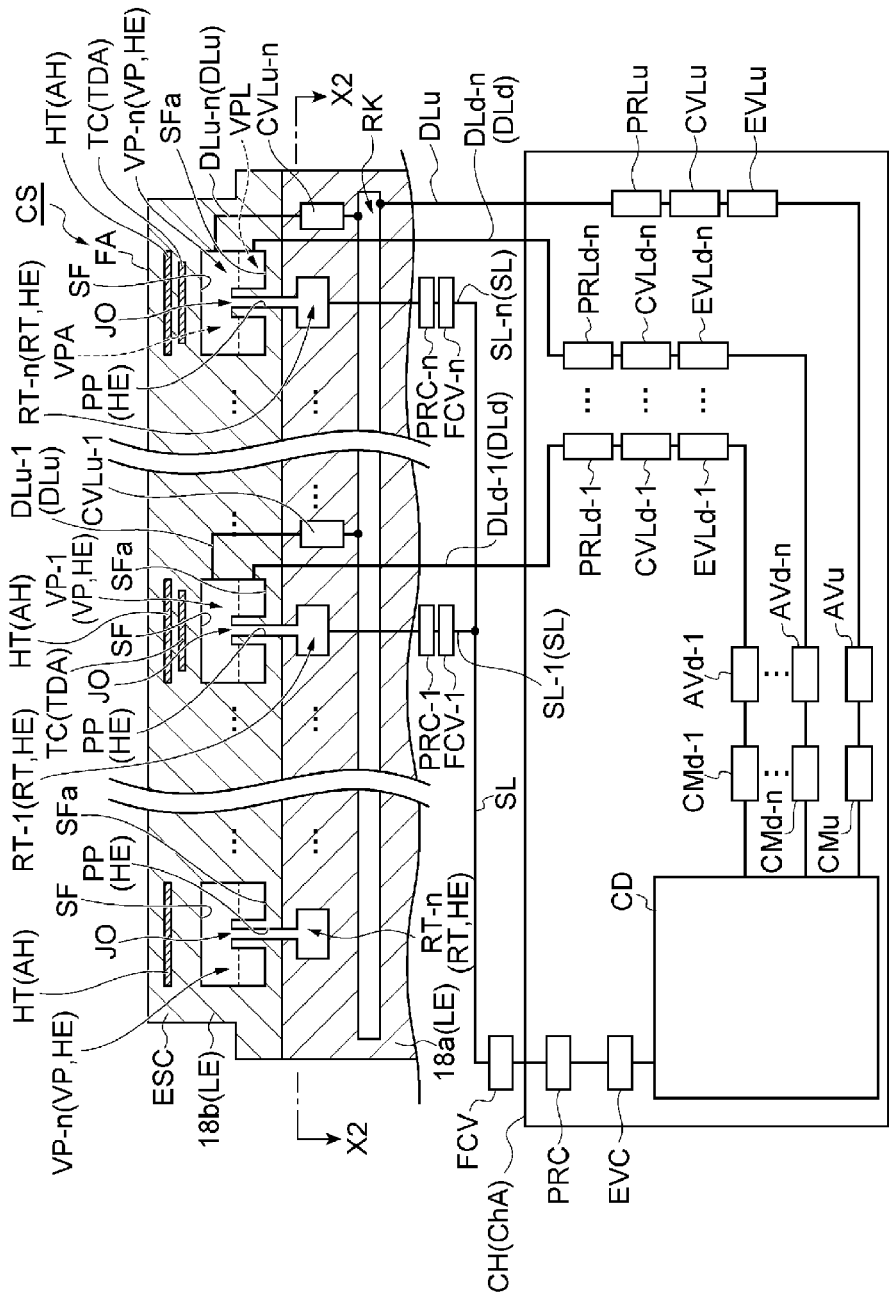
FIG. 10 is a diagram illustrating another configuration (exemplary experimental example 1) of the temperature adjustment system according to an exemplary embodiment of the present disclosure.

The chiller device ChA may include a chiller unit CH shown in each of FIG. 1 and FIG. 10. The chiller device ChA may include each of chiller units CH-1 to CH-n shown in FIG. 12. The chiller device ChA may further include a flow rate control valve FCV shown in each of FIG. 1 and FIG. 10, flow rate control valves FCV-1 to FCV-n and pressure gauges PRC-1 to PRC-n shown in each of FIG. 1, FIG. 10 and FIG. 12.

Figure 3:
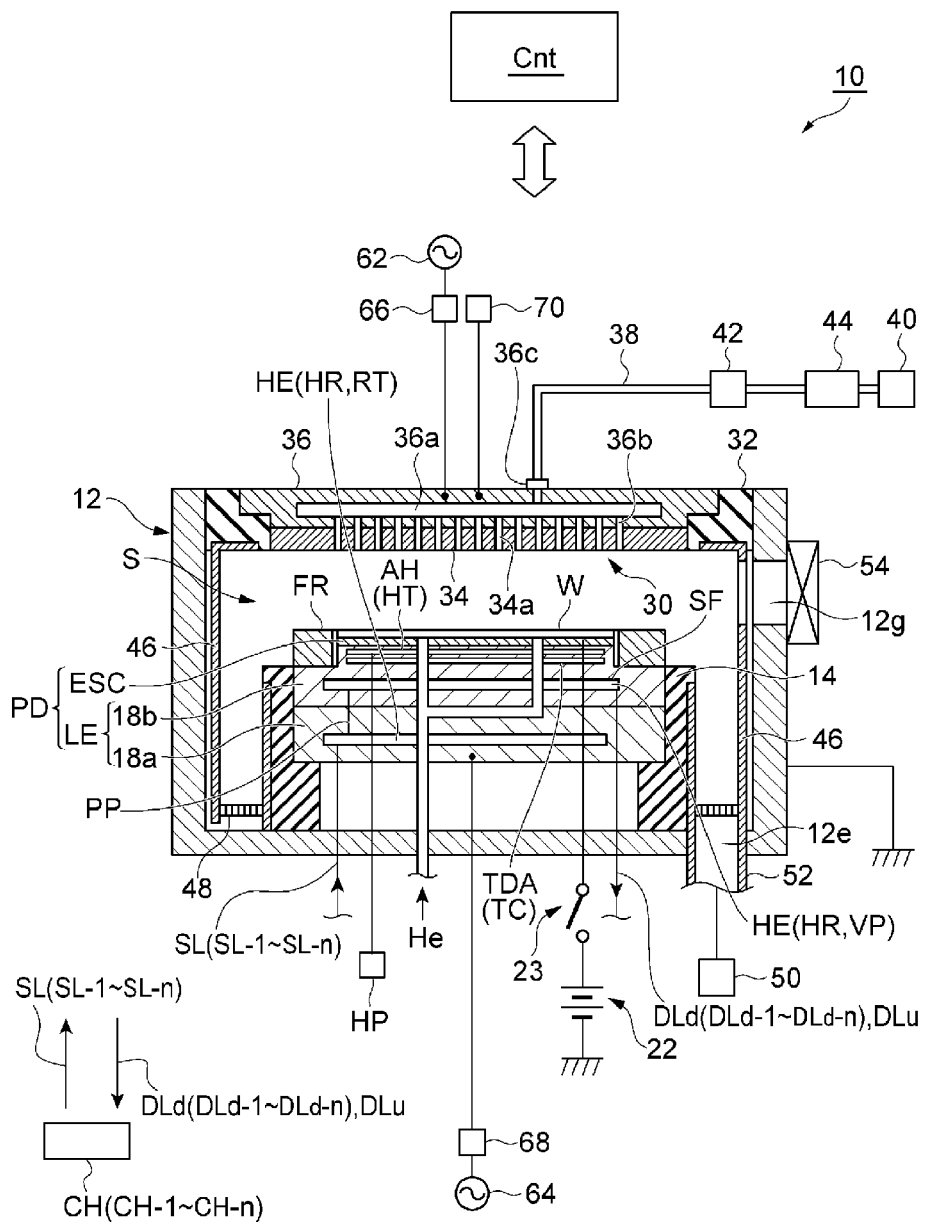
FIG. 3 is a diagram schematically illustrating an example of the configuration of a plasma processing apparatus in which the temperature adjustment system according to an exemplary embodiment of the present disclosure is used.

The temperature adjustment system CS can be used, for example, in the plasma processing apparatus 10 shown in FIG. 3. The condensing device CD and the compressor CM may be included in a chiller unit of the plasma processing apparatus 10 shown in FIG. 3.

Figure 2:
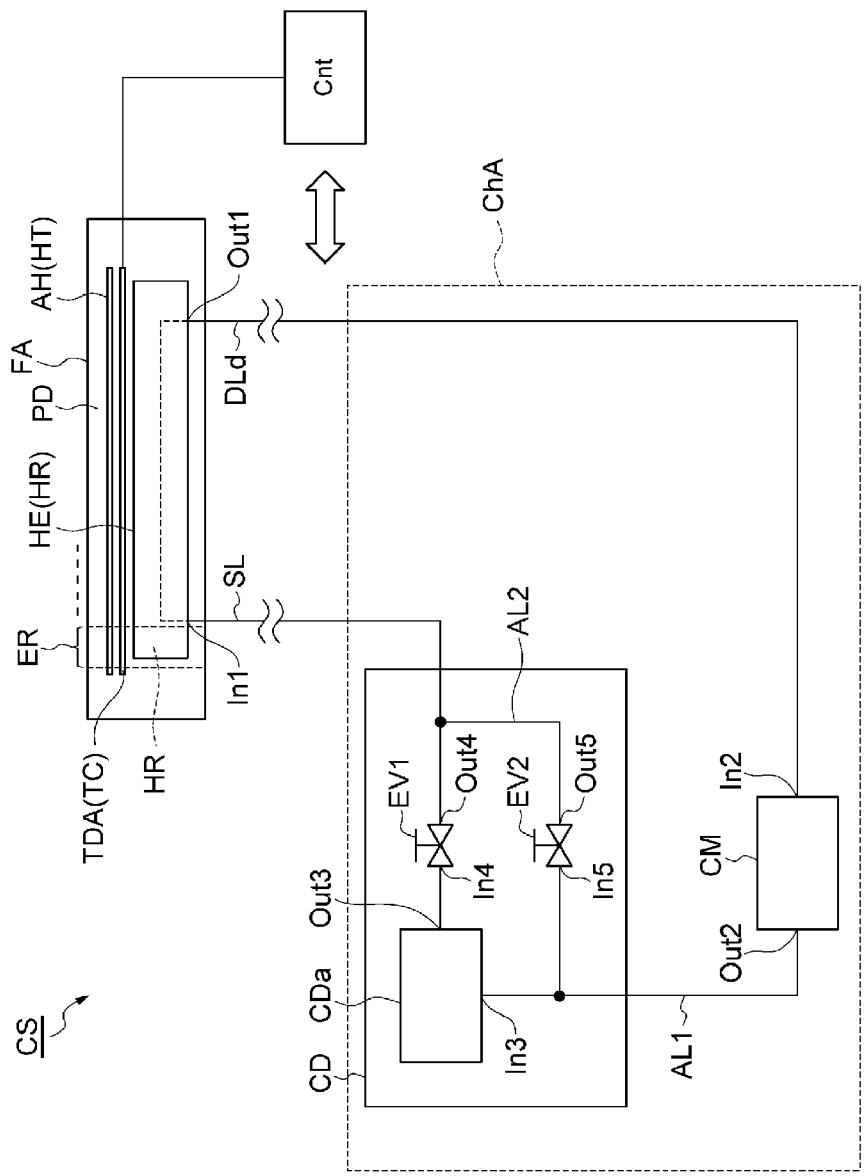
FIG. 2 is a diagram illustrating an example of the configuration of the temperature adjustment system according to an exemplary embodiment of the present disclosure.
Figure 12:
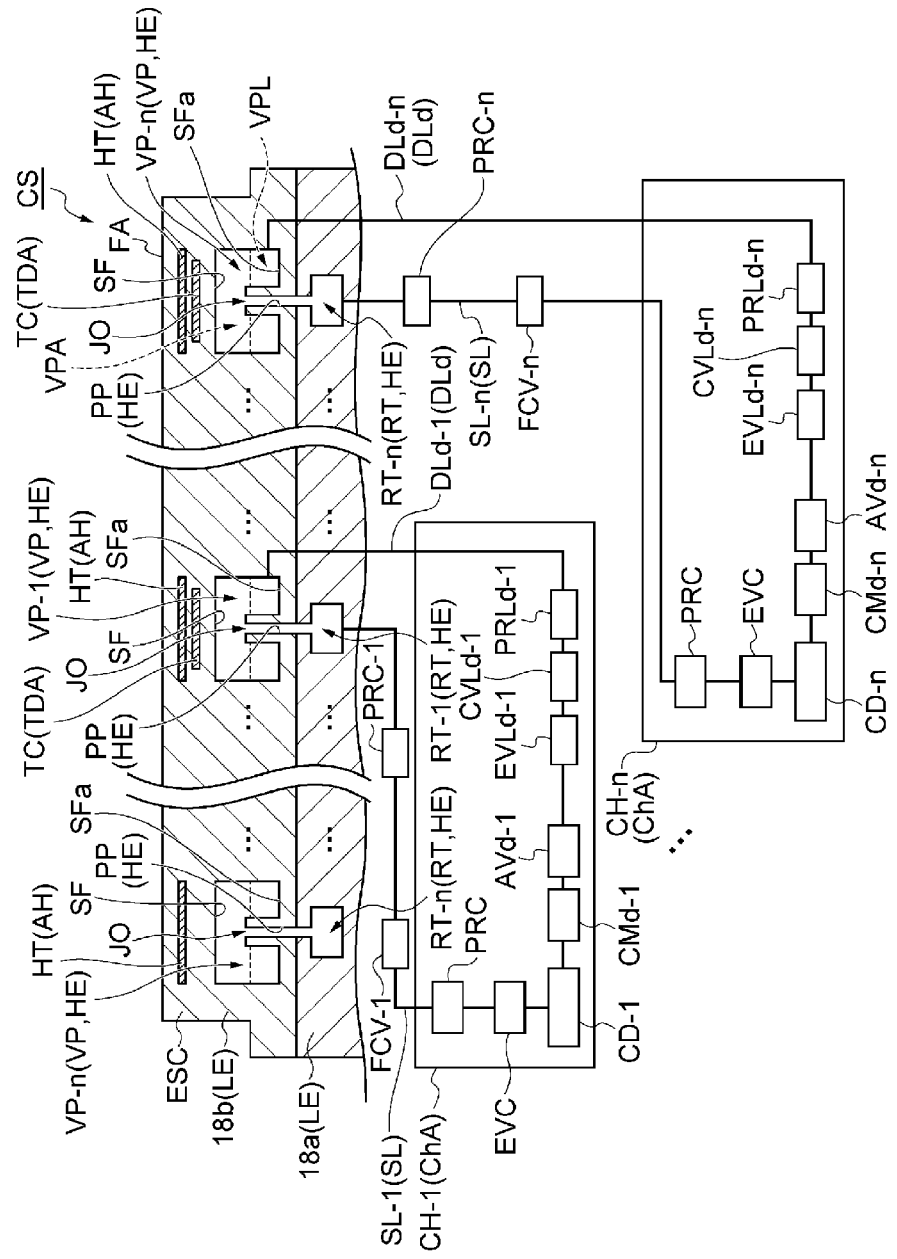
FIG. 12 is a diagram illustrating another configuration (exemplary experimental example 2) of the temperature adjustment system according to an exemplary embodiment of the present disclosure.

The temperature adjustment system CS shown in FIG. 1 and FIG. 2 corresponds to a temperature adjustment system shown in each of FIG. 10 and FIG. 12. The condensing device CD shown in FIG. 1 and FIG. 2 corresponds to a condensing device CD shown in FIG. 10 and each of condensing devices CD-1 to CD-n shown in FIG. 12.

The compressor CM shown in FIG. 2 corresponds to each of compressors CMd-1 to CMd-n shown in FIG. 1, each of compressors CMd-1 to CMd-n and a compressor CMu shown in FIG. 10 and each of compressors CMd-1 to CMd-n shown in FIG. 12.

The discharge line DLd is disposed between an output terminal Out1 of the heat exchange unit HE and an input terminal In2 of the compressor CM. The discharge line DLd sends, to the compressor CM, the coolant discharged from the heat exchange unit HE.

The supply line SL is disposed between an input terminal In1 of the heat exchange unit HE and an output terminal Out3 of the condenser CDa. The expansion valve EV1 is disposed in the supply line SL. The supply line SL sends the coolant condensed by the condenser CDa to the heat exchange unit HE through the expansion valve EV1. The coolant output from the expansion valve EV1 is in a liquid state, and the dryness fraction of the coolant output from the expansion valve EV1 is approximately equal to 0[%].

The gas line AL1 is disposed between an output terminal Out2 of the compressor CM and an input terminal In3 of the condenser CDa. The gas line AL2 is disposed between the output terminal Out2 of the compressor CM and an output terminal Out4 of the expansion valve EV1. In other words, the gas line AL2 is disposed between a region of the supply line SL between the expansion valve EV1 and the heat exchange unit HE, and the gas line AL1. The flow dividing valve EV2 is disposed in the gas line AL2.

The gas line AL2 divides a compressed coolant that is sent from the compressor CM to the gas line AL1. The flow dividing valve EV2 adjusts the flow rate of the coolant that is directly supplied from the compressor CM to the heat exchange unit HE through the gas line AL2. The coolant output from the flow dividing valve EV2 is in a gaseous state, and the dryness fraction of the coolant output from the flow dividing valve EV2 is approximately equal to 100[%].

An input terminal In4 of the expansion valve EV1 is connected to the output terminal Out3 of the condenser CDa via the supply line SL. The output terminal Out4 of the expansion valve EV1 is connected to the input terminal In1 of the heat exchange unit HE via the supply line SL. An input terminal In5 of the flow dividing valve EV2 is connected to the gas line AL1 via the gas line AL2. An output terminal Out5 of the flow dividing valve EV2 is connected to a region of the supply line SL between the expansion valve EV1 and the heat exchange unit HE via the gas line AL2.

The temperature adjustment system CS adjusts the temperature of the placing table PD. For example, the temperature of the placing table PD may be the temperature of the surface of the placing table PD (the placing surface FA on which the wafer W is placed). The placing table PD is disposed inside a processing container 12 of the plasma processing apparatus 10. The wafer W (target object) is placed on the placing table PD. The heat exchange unit HE is disposed inside the placing table PD and exchanges heat using the coolant.

The compressor CM compresses the coolant discharged from the heat exchange unit HE. The condenser CDa condenses the coolant compressed by the compressor CM.

The temperature detection device TDA measures the temperature of the placing table PD and transmits a measurement result to the control device Cnt. The temperature detectors TC included in the temperature detection device TDA are thermistors or the like and are disposed inside the placing table PD.

The control device Cnt includes a CPU, a ROM, a RAM, and the like. The control device Cnt causes the CPU to execute a computer program recorded in a recording device such as the ROM or the RAM. The computer program includes a program for causing the CPU to execute a function of controlling a general operation of the plasma processing apparatus 10. The computer program particularly includes a program for causing the CPU of the control device Cnt to execute a temperature adjustment processing for adjusting the temperature of the placing table PD using the temperature adjustment system CS.

The control device Cnt adjusts heat input to the placing table PD and the opening degree of each of the expansion valve EV1 and the flow dividing valve EV2 based on the temperature of the placing table PD measured by the temperature detection device TDA. More specifically, in a situation where the control device Cnt adjusts the opening degree of the expansion valve EV1 by opening the expansion valve EV1 and closing the flow dividing valve EV2 so that the placing table PD has a first temperature, the temperature of the placing table PD may be increased. In this case, the control device Cnt inputs heat to the placing table PD and adjusts the opening degree of the flow dividing valve EV2 by further opening the flow dividing valve EV2 so that the temperature of the placing table PD reaches a second temperature higher than the first temperature. The inputting of heat to the placing table PD may be performed using plasma. Further, the inputting of heat to the placing table PD may be performed by the heater HT.

When the temperature of the placing table PD reaches the second temperature, the control device Cnt finishes the heat input to the placing table PD and closes the flow dividing valve EV2. The control device Cnt adjusts a period of time for the temperature of the placing table PD to reach the second temperature by adjusting the opening degree of the flow dividing valve EV2.

The temperature adjustment system CS shown in FIG. 1 and FIG. 2 can be applied to the plasma processing apparatus 10 shown in FIG. 3. The condensing device CD of the temperature adjustment system CS shown in FIG. 1 and FIG. 2 can be applied to a condensing device CD shown in each of FIG. 5 and FIG. 10 and the condensing devices CD-1 to CD-n shown in FIG. 12.

Hereinafter, a temperature adjustment system CS to which the condensing device CD shown in FIG. 2 can be applied will be described. The temperature adjustment system CS can be used in the plasma processing apparatus 10 shown in FIG. 3. First, the configuration of the plasma processing apparatus 10 in which the temperature adjustment system CS can be used will be described with reference to FIG. 3.

The plasma processing apparatus 10 shown in FIG. 3 is a plasma etching apparatus including parallel plate electrodes and includes the processing container 12. For example, the processing container 12 has an approximately cylindrical shape. For example, the processing container 12 is made of an aluminum material, and an inner wall surface of the processing container 12 is anodically oxidized. The processing container 12 is frame grounded.

A support 14 having an approximately cylindrical shape is disposed on the bottom of the processing container 12. For example, the support 14 has an insulating material. The insulating material forming the support 14 may include oxygen like quartz. The support 14 extends in a vertical direction (toward an upper electrode 30) from the bottom of the processing container 12 inside the processing container 12.

The placing table PD is disposed inside the processing container 12. The placing table PD is supported by the support 14. The placing table PD holds the wafer W on an upper surface of the placing table PD. The placing table PD has a lower electrode LE and an electrostatic chuck ESC.

The lower electrode LE includes a first plate 18a and a second plate 18b. For example, the first plate 18a and the second plate 18b have a metal material such as aluminum and have an approximately disc shape. The second plate 18b is disposed on the first plate 18a and electrically connected to the first plate 18a. The electrostatic chuck ESC is disposed on the second plate 18b.

The electrostatic chuck ESC has a structure in which an electrode that is a conductive film is arranged between a pair of insulating layers or a pair of insulating sheets. A direct current power supply 22 is electrically connected to the electrode of the electrostatic chuck ESC via a switch 23. The electrostatic chuck ESC attracts the wafer W by electrostatic force such as Coulomb force generated by a DC voltage from the direct current power supply 22. Accordingly, the electrostatic chuck ESC can hold the wafer W.

A focus ring FR is disposed on a peripheral portion of the second plate 18b so as to surround an edge of the wafer W and the electrostatic chuck ESC. The focus ring FR is disposed to improve the uniformity of etching. The focus ring FR has a material that is appropriately selected depending on the material of an etching target film and may have, for example, quartz.

Divided chambers VP-1 to VP-n shown in FIG. 1, FIG. 10 and FIG. 12 are disposed inside the second plate 18b. An evaporation chamber VP may lower the temperature of the electrostatic chuck ESC on a heat transfer wall SF of the evaporation chamber VP by evaporating the coolant on the heat transfer wall SF of the evaporation chamber VP and thus cool the wafer W placed on the electrostatic chuck ESC. Divided chambers RT-1 to RT-n shown in FIG. 1, FIG. 10 and FIG. 12 are disposed inside the first plate 18a. A retention chamber RT retains the coolant to be supplied to the evaporation chamber VP.

In the present specification, a phenomenon of a change in phase to gas from either solid or liquid is referred to as "vaporization" and the occurrence of vaporization only on the surface of solid or liquid is referred to as "evaporation". Further, the occurrence of vaporization from the inside of liquid is referred to as "boiling". When the coolant is discharged and comes into contact with the heat transfer wall, the coolant evaporates to gas from liquid. At this point, a heat amount called latent heat or vaporization heat moves to the coolant from the heat transfer wall.

The plasma processing apparatus 10 includes the chiller unit CH shown in FIG. 1 and FIG. 10 (or the chiller units CH-1 to CH-n shown in FIG. 12). The chiller unit CH or the like decreases the temperature of the electrostatic chuck ESC and cools the wafer W placed on the electrostatic chuck ESC by circulating the coolant through the supply line SL or the like, the retention chamber RT or the like, the evaporation chamber VP or the like, and the discharge line DLd or the like.

The chiller unit CH or the like includes the chiller unit CH shown in each of FIG. 1, FIG. 3 and FIG. 10 and the chiller units CH-1 to CH-n shown in FIG. 12. The supply line SL or the like includes a supply line SL shown in each of FIG. 2 and FIG. 3 and branch lines SL-1 to SL-n shown in each of FIG. 1, FIG. 10 and FIG. 12. The retention chamber RT or the like includes a retention chamber RT shown in FIG. 3 and the divided chambers RT-1 to RT-n shown in each of FIG. 1, FIG. 10 and FIG. 12. The evaporation chamber VP or the like includes an evaporation chamber VP shown in FIG. 3 and the divided chambers VP-1 to VP-n shown in each of FIG. 1, FIG. 10 and FIG. 12. The discharge line DLd or the like includes a discharge line DLd shown in each of FIG. 2 and FIG. 3, branch lines DLd-1 to DLd-n shown in each of FIG. 1, FIG. 10 and FIG. 12, and a discharge line DLu shown in FIG. 10.

The coolant is supplied from the chiller unit CH or the like to the retention chamber RT or the like through the supply line SL or the like. The coolant is discharged from the evaporation chamber VP or the like to the chiller unit CH or the like through the discharge line DLd or the like.

The plasma processing apparatus 10 includes a temperature adjustment system CS including the above-described evaporation chamber VP or the like, retention chamber RT or the like and the chiller unit CH or the like. The specific configuration of the temperature adjustment system CS will be described later.

The plasma processing apparatus 10 is equipped with a gas supply line 28. The gas supply line 28 supplies a heat transfer gas, for example, He gas, from a heat transfer gas supply mechanism to a space between an upper surface of the electrostatic chuck ESC and a rear surface of the wafer W.

The plasma processing apparatus 10 is equipped with the heater HT which is a heating element. For example, the heater HT is embedded inside the second plate 18b. A heater power supply HP is connected to the heater HT.

By supplying power from the heater power supply HP to the heater HT, the temperature of the placing table PD is adjusted and the temperature of the wafer W placed on the placing table PD is adjusted. The heater HT may be built in the electrostatic chuck ESC.

The plasma processing apparatus 10 includes the upper electrode 30. The upper electrode 30 is disposed above the placing table PD so as to face the placing table PD. The lower electrode LE and the upper electrode 30 are disposed substantially parallel to each other. A processing space S for performing a plasma processing on the wafer W is disposed between the upper electrode 30 and the lower electrode LE.

The upper electrode 30 is supported on an upper part of the processing container 12 via an insulating shielding member 32. The insulating shielding member 32 has an insulating material and may contain oxygen like quartz. The upper electrode 30 may include an electrode plate 34 and an electrode support 36.

The electrode plate 34 faces the processing space S and is provided with a plurality of gas discharge holes 34a. In an exemplary embodiment, the electrode plate 34 contains silicon. In another exemplary embodiment, the electrode plate 34 may contain silicon oxide.

The electrode support 36 detachably supports the electrode plate 34 and may have a conductive material such as aluminum. The electrode support 36 may have a water cooling structure. A gas diffusion chamber 36a is disposed inside the electrode support 36.

A plurality of gas through holes 36b that communicates with the gas discharge holes 34a extends downwards (toward the placing table PD) from the gas diffusion chamber 36a. The electrode support 36 is provided with a gas inlet 36c for guiding a processing gas to the gas diffusion chamber 36a, and a gas supply pipe 38 is connected to the gas inlet 36c.

A gas source group 40 is connected to the gas supply pipe 38 via a valve group 42 and a flow rate controller group 44. The gas source group 40 has a plurality of gas sources.

The valve group 42 includes a plurality of valves, and the flow rate controller group 44 includes a plurality of flow rate controllers such as a mass flow controller. Each of the plurality of gas sources of the gas source group 40 is connected to the gas supply pipe 38 via a corresponding valve of the valve group 42 and a corresponding flow rate controller of the flow rate controller group 44.

Accordingly, the plasma processing apparatus 10 can supply gases from one or more gas sources selected from the plurality of gas sources of the gas source group 40 into the processing container 12 at individually adjusted flow rates.

In the plasma processing apparatus 10, a deposition shield 46 is detachably disposed along an inner wall of the processing container 12. The deposit shield 46 is also disposed on an outer periphery of the support 14. The deposition shield 46 suppresses adhesion of an etching by-product (deposit) to the processing container 12 and may have a structure in which an aluminum material is coated with ceramic such as $Y_2O_3$. The deposition shield may have a material containing oxygen, such as quartz, in addition to $Y_2O_3$.

An exhaust plate 48 is disposed on the bottom side of the processing container 12 (on the side with the support 14) and between the support 14 and a side wall of the processing container 12. For example, the exhaust plate 48 may have a structure in which an aluminum material is coated with ceramic such as $Y_2O_3$. An exhaust port 12e is disposed below the exhaust plate 48 in the processing container 12. An exhaust device 50 is connected to the exhaust port 12e via an exhaust pipe 52.

The exhaust device 50 has a vacuum pump such as a turbo molecular pump and can depressurize a space inside the processing container 12 to a desired vacuum level. A carry-in/out port 12g for the wafer W is disposed on the side wall of the processing container 12 and the carry-in/out port 12g can be opened and closed by a gate valve 54.

The plasma processing apparatus 10 further includes a first high frequency power supply 62 and a second high frequency power supply 64. The first high frequency power supply 62 is a power supply that generates first high frequency power for plasma formation and generates high frequency power having a frequency of 27 to 100 [MHz], for example, 60 [MHz]. The first high frequency power supply 62 is connected to the upper electrode 30 via a matching device 66. The matching device 66 is a circuit for matching an output impedance of the first high frequency power supply 62 with an input impedance on a load side (lower electrode LE side). Alternatively, the first high frequency power supply 62 may be connected to the lower electrode LE via the matching device 66.

The second high frequency power supply 64 is a power supply that generates second high frequency power for ion attraction into the wafer W, i.e., high frequency bias power. The second high frequency power supply 64 generates high frequency bias power having a frequency of 400 [kHz] to 40.68 [MHz], for example, 13.56 [MHz]. The second high frequency power supply 64 is connected to the lower electrode LE via a matching device 68. The matching device 68 is a circuit for matching an output impedance of the second high frequency power supply 64 with an input impedance on the load side (lower electrode LE side).

The plasma processing apparatus 10 further includes a power supply 70. The power supply 70 is connected to the upper electrode 30. The power supply 70 applies, to the upper electrode 30, a voltage for attracting positive ions present in the processing space S to the electrode plate 34. In an example, the power supply 70 is a direct current power supply that generates a negative direct current voltage. When such a voltage is applied to the upper electrode 30 from the power supply 70, positive ions present in the processing space S collide with the electrode plate 34. Thus, secondary electrons and/or silicon are released from the electrode plate 34.

In the exemplary embodiment, the plasma processing apparatus 10 may include the control device Cnt shown in FIG. 2. The control device Cnt is connected to the valve group 42, the flow rate controller group 44, the exhaust device 50, the first high frequency power supply 62, the matching device 66, the second high frequency power supply 64, the matching device 68, the power supply 70, the heater power supply HP, and the like. The control device Cnt is further connected to the chiller unit CH (or the chiller units CH-1 to CH-n shown in FIG. 12) and the like.

The control device Cnt may use a control signal to control selection and the flow rate of a gas supplied from the gas source group 40, exhausting of the exhaust device 50 and supply of power from the first high frequency power supply 62 and the second high frequency power supply 64. The control device Cnt may also use a control signal to control voltage application from the power supply 70, supply of power from the heater power supply HP, the flow rate of the coolant supplied to the evaporation chamber VP or the like from the chiller unit CH or the like.

The control device Cnt causes the CPU to execute a computer program recorded in a recording device such as the ROM or the RAM. In particular, the computer program includes a program for causing the CPU of the control device Cnt to execute a recipe relating to a plasma processing performed by the plasma processing apparatus 10.

Figure 6:
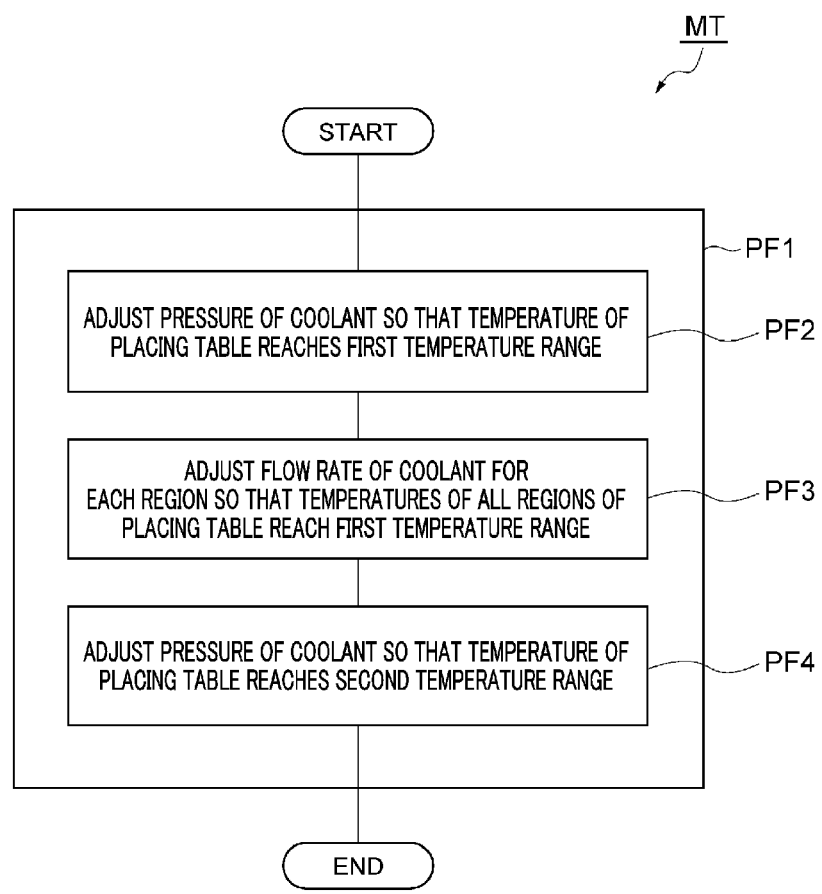
FIG. 6 is a flowchart showing an example of a temperature adjustment method according to an exemplary embodiment of the present disclosure.

In particular, the control device Cnt executes a temperature adjustment method MT shown in FIG. 6. The control device Cnt controls the chiller device ChA to adjust the pressure of the coolant so that the temperature of the placing table PD reaches a first temperature range. Thereafter, the control device Cnt controls the chiller device ChA to individually adjust the flow rate of the coolant supplied to each of the plurality of heat exchange chambers HR so that all of temperatures measured by the plurality of temperature detectors TC reach the first temperature range. As described above, first, the pressure of the coolant is adjusted over the entire placing table PD (all the regions ER of the placing table PD) so that the temperature of the placing table PD is adjusted to the first temperature range. Thereafter, the flow rate of the coolant is individually adjusted for each region ER so that all the regions ER of the placing table PD have temperatures in the first temperature range. Therefore, the non-uniformity in the temperature of the placing table PD can be efficiently reduced.

Further, after all the temperatures measured by the plurality of temperature detectors TC reach the first temperature range, the control device Cnt controls the chiller device ChA to adjust the pressure of the coolant so that the temperature of the placing table PD reaches a second temperature range different from the first temperature range. As described above, after the temperatures of all the regions ER of the placing table PD are adjusted to the first temperature range, the pressure of the coolant is adjusted, and, thus, the temperature of the placing table PD is adjusted to the second temperature range, which can be relatively easily achieved. Therefore, if the temperature of the placing table PD is changed during the processing, the non-uniformity in the temperature of the placing table PD is temporarily removed by adjusting the flow rate of the coolant for each region ER, and then the temperature of the placing table PD (all the regions ER of the placing table PD) can be entirely changed. Accordingly, it is possible to easily adjust the temperature of the placing table PD while maintaining the in-plane temperature of the placing table PD uniformly.

Further, in some cases, the control device Cnt may adjust the pressure of the coolant. The control device Cnt may further perform at least one of adjustment of heat generation amount from each of the plurality of heaters HT by controlling each of the plurality of heaters HT or adjustment of the dryness fraction of the coolant by controlling the chiller device ChA based on the temperatures measured by the temperature detectors TC. As described above, when the pressure of the coolant is adjusted, for example, if the temperature of the placing table PD is increased, at least one of the dryness fraction of the coolant or the heat generation amount from the heaters HT is adjusted together with the pressure of the coolant (in all the regions ER of the placing table PD). Accordingly, the temperature of the placing table PD can be increased more quickly.

Further, when the flow rate of the coolant is adjusted, the control device Cnt controls the heaters HT based on the temperatures measured by the temperature detectors TC to further adjust the heat generation mount from each of the heaters HT. As described above, when the flow rate of the coolant is adjusted, for example, if the temperature of the placing table PD is increased, adjustment of the heat generation amount from the heater HT for each region ER is performed together with adjustment of the flow rate of the coolant for each region ER. Accordingly, the temperature of each region ER can be increased more accurately and quickly.

The temperature adjustment method MT according to the exemplary embodiment of the present disclosure will be described with reference to FIG. 6. The temperature adjustment method MT includes a process PF1 (first process). In the process PF1, the temperature of the placing table PD may be adjusted before and during execution of a processing. The process PF1 includes processes PF2 (second process), PF3 (third process) and PF4 (fourth process).

In the process PF2, the temperatures of all the regions ER of the placing table PD are collectively adjusted to the first temperature range. A set temperature in the temperature adjustment system CS can be directly related to the pressure of the coolant (an evaporation temperature at an evaporation pressure). Therefore, in the process PF2, the pressure of the coolant is adjusted collectively for all the regions ER of the placing table PD so that the temperature of the placing table PD reaches the first temperature range.

In the process PF2, the control device Cnt controls the opening degree of the expansion valve EV1 to adjust the pressure of the coolant in the entire supply line SL. When the temperature of the placing table PD is increased in the process PF2, the opening degree of the expansion valve EV1 is increased. Since the opening degree of the expansion valve EV1 is increased, the evaporation pressure of the coolant is also increased, and, thus, the evaporation temperature of the coolant can be increased. When the temperature of the placing table PD is decreased in the process PF2, the opening degree of the expansion valve EV1 is decreased. Since the opening degree of the expansion valve EV1 is decreased, the evaporation pressure of the coolant is also decreased, and, thus, the evaporation temperature of the coolant can be decreased.

Also, when the temperature of the placing table PD is increased in the process PF2, the pressure of the coolant may be adjusted (increased) and at least one of the adjustment of the dryness fraction of the coolant or the adjustment of the heat generation amount from the plurality of heaters HT may be further performed based on the temperatures measured by the temperature detectors TC. The adjustment of the dryness fraction of the coolant may be performed collectively for all the regions ER of the placing table PD by adjusting the opening degree of the flow dividing valve EV2 by the control device Cnt. When the temperature of the placing table PD is increased, the opening degree of the flow dividing valve EV2 is increased and the coolant contains more gaseous coolant, and, thus, the dryness fraction of the coolant is increased. When the temperature of the placing table PD is increased by using the dryness fraction of the coolant, the non-uniformity in the temperature of the placing table PD is temporarily removed, and, thus, the temperature of the placing table PD becomes approximately uniform. In this state, the uniformity in the temperature is maintained and the temperature of the entire placing table PD can be easily changed. When the temperature of the placing table PD is decreased, the flow dividing valve EV2 is closed and the coolant contain gaseous coolant as little as possible, and, thus, the dryness fraction of the coolant is approximately equal to 0%.

After the temperature of the placing table PD is adjusted to the first temperature range in the process PF2, the process PF3 is performed. In the process PF3, the flow rate of the coolant is adjusted for each region ER based on the temperatures measured by the temperature detectors TC so that the temperatures of all the regions ER of the placing table PD reach the first temperature range. Thus, the temperature of each region ER is adjusted. In this case, in the process PF3, the flow rate of the coolant supplied to each of the plurality of heat exchange chambers HR is adjusted such that all the temperatures measured by the plurality of temperature detectors TC reach the first temperature range after the process PF2.

The flow rate of the coolant is adjusted for each region ER by controlling the flow rate control valves FCV-1 to FCV-n connected to the branch lines SL-1 to SL-n, respectively, by the control device Cnt. The control of each of the flow rate control valves FCV-1 to FCV-n may be control of the opening degree and time as shown in FIG. 9. In the process PF3, the temperatures of the plurality of regions ER can be made uniform by adjusting the flow rate of the coolant distributed for each region ER.

Further, in the process PF3, when the temperature of the placing table PD is increased, the flow rate of the coolant may be adjusted for each region ER and the heat generation amount from the plurality of heaters HT may be further adjusted. In process PF3, the heat generation amount from the plurality of heaters HT is adjusted for each region ER, i.e., for each heater HT.

In the process PF4, the temperatures of all the regions ER of the placing table PD are collectively adjusted to the second temperature range in a state where the non-uniformity of the temperatures of all the regions ER of the placing table PD is removed by a series of the processes PF2 and PF3. The second temperature range is different from the first temperature range. In the process PF4, similarly to the case of the process PF2, the pressure of the coolant is adjusted collectively for all the regions ER of the placing table PD so that the temperature of the placing table PD reaches the second temperature range.

In the process PF4, the control device Cnt controls the opening degree of the expansion valve EV1 to adjust the pressure of the coolant in the entire supply line SL. When the temperature of the placing table PD is increased in the process PF4, the opening degree of the expansion valve EV1 is increased. Since the opening degree of the expansion valve EV1 is increased, the evaporation pressure of the coolant is also increased, and, thus, the evaporation temperature of the coolant can be increased. When the temperature of the placing table PD is decreased in the process PF4, the opening degree of the expansion valve EV1 is decreased. Since the opening degree of the expansion valve EV1 is decreased, the evaporation pressure of the coolant is also decreased, and, thus, the evaporation temperature of the coolant can be decreased.

Also, when the temperature of the placing table PD is increased in the process PF4, the process PF4 is performed similarly to the case of the process PF2. That is, in this case, in the process PF4, the pressure of the coolant may be adjusted (increased) and at least one of the adjustment of the dryness fraction of the coolant or the adjustment of the heat generation amount from the plurality of heaters HT may be further performed based on the temperatures measured by the temperature detectors TC. The adjustment of the dryness fraction of the coolant may be performed collectively for all the regions ER of the placing table PD by adjusting the opening degree of the flow dividing valve EV2 by the control device Cnt. When the temperature of the placing table PD is increased, the opening degree of the flow dividing valve EV2 is increased and the coolant contains more gaseous coolant, and, thus, the dryness fraction of the coolant is increased. When the temperature of the placing table PD is increased by using the dryness fraction of the coolant, the non-uniformity in the temperature of the placing table PD is temporarily removed, and, thus, the temperature of the placing table PD becomes approximately uniform. In this state, the uniformity in the temperature is maintained and the temperature of the entire placing table PD can be easily changed. When the temperature of the placing table PD is decreased, the flow dividing valve EV2 is closed and the coolant contain gaseous coolant as little as possible, and, thus, the dryness fraction of the coolant is approximately equal to 0%.

According to the series of processes PF2 and PF3, first, the pressure of the coolant is adjusted over the entire placing table PD so that the temperature of the placing table PD is adjusted to the first temperature range. Then, the flow rate of the coolant is adjusted for each region ER so that all the regions of the placing table PD have temperatures in the first temperature range. Therefore, the non-uniformity in the temperature of the placing table PD can be efficiently reduced.

Further, in the process PF2, for example, when the temperature of the placing table PD is increased, at least one of the dryness fraction of the coolant or the heat generation amount from the heaters HT is adjusted together with the pressure of the coolant. Accordingly, the temperature of the placing table PD can be increased more quickly.

Furthermore, in the process PF3, for example, when the temperature of the placing table is increased, the adjustment of the heat generation amount from the heater HT for each region ER is performed together with the adjustment of the flow rate of the coolant for each region ER. Accordingly, the temperature of each region ER of the placing table PD can be increased more accurately and quickly.

According to the process PF4, after the temperatures of all the regions ER of the placing table PD are adjusted for each region ER to the first temperature range in the process PF3, the pressure of the coolant is adjusted, and, thus, the temperature of the placing table PD is adjusted to the second temperature range, which can be relatively easily achieved.

Further, in the process PF4, for example, when the temperature of the placing table PD is increased, at least one of the dryness fraction of the coolant or the heat generation amount from the heaters HT is adjusted together with the pressure of the coolant. Accordingly, the temperature of the placing table PD can be increased more quickly.

A heating resolution $\Delta X$ by the heater HT is about $5[° C.]$, and a cooling resolution $\Delta Y$ by the chiller device ChA is about $-70[° C.]$. The absolute value of $\Delta X/\Delta Y$ may be about 10 to 20.

According to the above-described temperature adjustment system CS, when the wafer W is placed on the placing surface FA, even if the temperature of the wafer W is not uniform due to variations in the heat input of plasma, the temperature of the wafer W can be adjusted to be uniform. Further, even when the temperature of the wafer W is changed during the processing, it is possible to easily change the temperature of the wafer W while maintaining the in-plane temperature of the wafer W uniformly.

FIG. 1 is a diagram illustrating in detail the configuration of the temperature adjustment system CS according to the exemplary embodiment of the present disclosure. The temperature adjustment system CS includes the chiller unit CH, the supply line SL, the discharge line DLd and the heat exchange unit HE.

The heat exchange unit HE is equipped with the evaporation chamber VP, the retention chamber RT and a plurality of pipes PP. Each pipe PP has a discharge hole JO. The heat exchange unit HE is disposed inside the placing table PD and exchanges heat using the coolant via the placing surface FA of the placing table PD.

The retention chamber RT retains the coolant supplied from the chiller unit CH through the supply line SL. The retention chamber RT is connected to the chiller unit CH via the supply line SL and communicates with the evaporation chamber VP via the plurality of pipes PP.

The evaporation chamber VP evaporates the coolant retained in the retention chamber RT. The evaporation chamber VP is connected to the chiller unit CH via the discharge line DLd, extends over the placing surface FA of the placing table PD and includes a plurality of discharge holes JO. The discharge hole JO is provided at one end of the pipe PP and is disposed such that the coolant is discharged from the pipe PP toward the heat transfer wall SF on the placing surface FA side of an inner wall of the evaporation chamber VP.

The chiller unit CH is connected to the heat exchange unit HE via the supply line SL for the coolant and the discharge line DLd for the coolant. The chiller unit CH supplies the coolant to the heat exchange unit HE through the supply line SL and discharges the coolant from the heat exchange unit HE through the discharge line DLd.

The chiller unit CH includes a pressure gauge PRLd, a check valve CVLd, an expansion valve EVLd, an adjustment valve AV, the compressor CM, the condensing device CD, an expansion valve EVC and a pressure gauge PRC.

The evaporation chamber VP is disposed on the second plate 18*b* and the retention chamber RT is disposed on the first plate 18*a*.

More specifically, the supply line SL connects the condensing device CD and the retention chamber RT. More specifically, the discharge line DLd connects the condensing device CD and the evaporation chamber VP.

In the chiller unit CH, the expansion valve EVC and the pressure gauge PRC are serially disposed in the supply line SL in order from a condensing device CD side. In the chiller unit CH, the compressor CM, the adjustment valve AV, the expansion valve EVLd, the check valve CVLd and the pressure gauge PRLd are serially disposed in the discharge line DLd in order from the condensing device CD side.

An outlet of the condensing device CD is connected to an inlet of the expansion valve EVC, and an outlet of the expansion valve EVC is connected to an inlet of the pressure gauge PRC. An outlet of the pressure gauge PRC is connected to the retention chamber RT.

An inlet of the condensing device CD is connected to an outlet of the compressor CM, and an inlet of the compressor CM is connected to an outlet of the adjustment valve AV. An inlet of the adjustment valve AV is connected to an outlet of the expansion valve EVLd, and an inlet of the expansion valve EVLd is connected to an outlet of the check valve CVLd.

An inlet of the check valve CVLd is connected to an outlet of the pressure gauge PRLd, and an inlet of the pressure gauge PRLd is connected to the discharge line DLd. The discharge line DLd is connected to a liquid accumulation region VPL extending below the discharge hole JO in the evaporation chamber VP. The liquid accumulation region VPL is a region ranging from the surface of an exposed bottom wall SFa to the discharge hole JO inside the evaporation chamber VP.

The liquid accumulation region VPL is a spatial region where a coolant in a liquid state (coolant as a liquid) of the coolant discharged from the discharge hole JO can be collected (hereinafter, the same applies to the present disclosure). Further, in the evaporation chamber VP, a region other than the liquid accumulation region VPL includes a gas diffusion region VPA. The gas diffusion region VPA extends above the discharge hole JO in the evaporation chamber VP and is a spatial region where the coolant in a gaseous state (coolant as a gas) of the coolant discharged from the discharge hole JO can be diffused (hereinafter, the same applies to the present specification).

The opening degree [%] of each of the expansion valve EVC, the adjustment valve AV, the expansion valve EVLd and the check valve CVLd is controlled by the control device Cnt.

Figure 4:
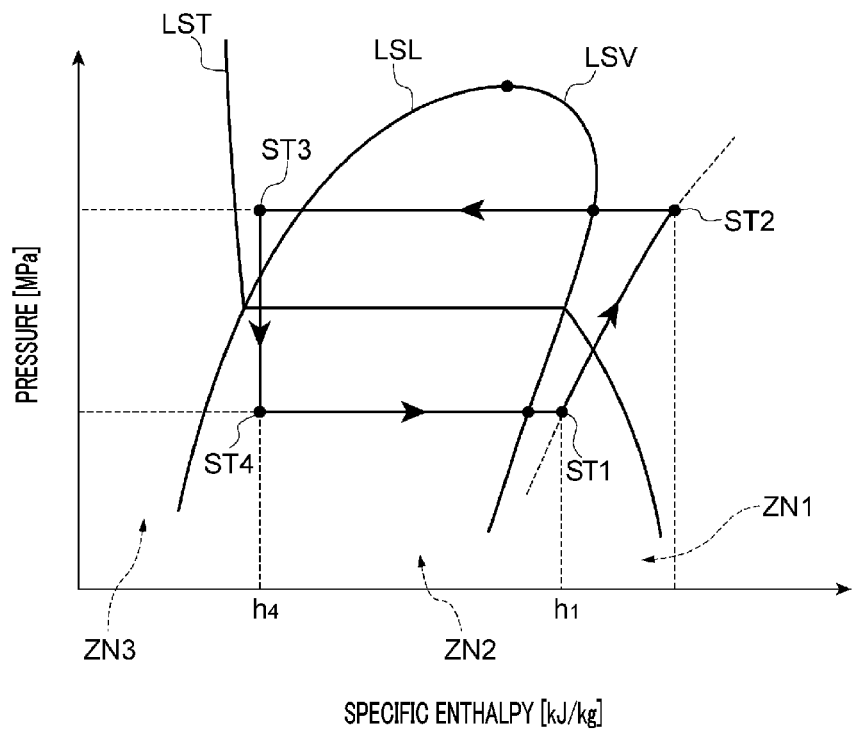
FIG. 4 is a diagram illustrating a Ph diagram (Mollier diagram) representing an example of a refrigeration cycle of the temperature adjustment system according to an exemplary embodiment of the present disclosure.
Figure 5:
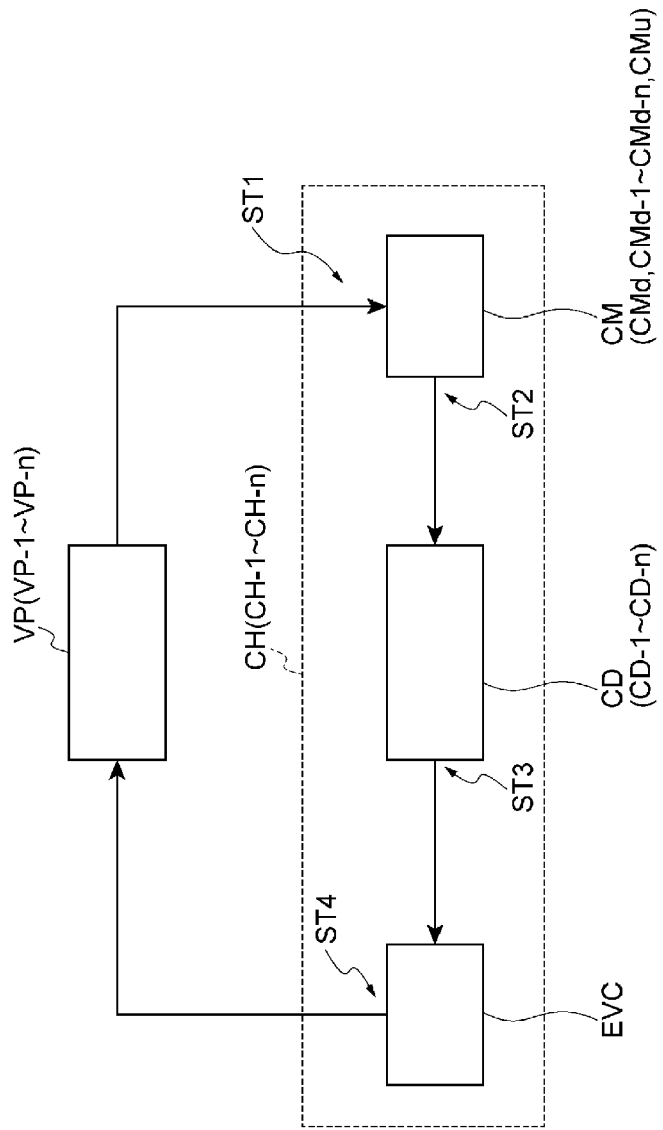
FIG. 5 is a diagram for describing the refrigeration cycle of the temperature adjustment system according to an exemplary embodiment of the present disclosure along with FIG. 4.

A refrigeration cycle of the temperature adjustment system CS will be described with reference to FIG. 4 and FIG. 5. FIG. 4 is a diagram illustrating a Ph diagram (Mollier diagram) representing a refrigeration cycle of the temperature adjustment system CS. FIG. 5 is a diagram for describing the refrigeration cycle of the temperature adjustment system CS along with FIG. 4.

First, the coolant discharged from the evaporation chamber VP (or the divided chambers VP-1 to VP-n shown in FIG. 1, FIG. 10 and FIG. 12) of the heat exchange unit HE reaches inlets of the compressors CMd-1 to CMd-n shown in FIG. 1, FIG. 10 and FIG. 12 and an inlet of the compressor CMu shown in FIG. 10 and comes into a state ST1. The state ST1 is in a superheated vapor zone ZN1. The coolant reaches the outlet of the compressor CM while being compressed along a constant specific entropy line by the compressor CM and comes into a state ST2. The state ST2 is in a superheated vapor zone ZN1.

The coolant discharged from the compressor CM traverses a saturated vapor line LSV and a saturated liquid line LSL while being condensed along an isobar by the condensing device CD (or the condensing devices CD-1 to CD-n shown in FIG. 12), and reaches the outlet of the condensing device CD and comes into a state ST3. The state ST3 is in a supercooling zone ZN3. The coolant discharged from the condensing device CD traverses the saturated liquid line LSL while being expanded along a constant specific enthalpy line by the expansion valve EVC, reaches the outlet of the expansion valve EVC and comes into a state ST4. The state ST4 is in a wet vapor zone ZN2.

In the Ph diagram shown in FIG. 4, isotherms are usually drawn at an interval of 10° C. across the supercooling zone ZN3, the wet vapor zone ZN2 and the superheated vapor zone ZN1. An isotherm LST shown in FIG. 4 extends as a right downward curve similar to a vertical line in the supercooling zone ZN3 as the specific enthalpy increases. Further, the isotherm LST bends at an intersection with the saturated liquid line LSL and extends as a horizontal straight line (as a line at a constant pressure) in the wet vapor zone ZN2 as the specific enthalpy increases.

Furthermore, the isotherm LST bends again at an intersection of the saturated vapor line LSV and extends as a right downward curve in the superheated vapor zone ZN1 as the specific enthalpy increases. The isotherm LST shown in FIG. 4 is an example of such an isotherm. The coolant in the wet vapor zone ZN2 is in an intermediate state during evaporation or condensation, and saturated liquid and saturated vapor coexist. In a theoretical refrigeration cycle, pressure and temperature are constant during evaporation or condensation.

The coolant that is discharged from the expansion valve EVC and is in a wet vapor state having a low pressure and a low temperature (state ST4) takes heat from the heat transfer wall SF while being evaporated along an isobar by the evaporation chamber VP, and traverses the saturated vapor line LSV and reaches the outlet of the evaporation chamber VP. In the theoretical refrigeration cycle, in a saturated state, a saturation temperature is determined by specifying the pressure of the coolant and a saturation pressure is determined by specifying the temperature. Therefore, an evaporation temperature of the coolant can be controlled by pressure.

In the evaporation chamber VP, the specific enthalpy of the coolant increases from h4 to h1 during an isothermal change (from the state ST4 to the state ST1). The amount of heat taken by the coolant [kg] from a surrounding cooling target object (heat transfer wall) is called a refrigeration effect Wr [kJ/kg], which is equal to the amount of heat received by the coolant [1 kg] from the cooling target object and equal to the amount of increase (h1-h4 [kJ/kg]) in the specific enthalpy of the coolant from the inlet to the outlet of the evaporation chamber VP. Thus, a relationship of Wr=h1-h4 is established.

A refrigeration capacity ϕ0 [kJ/s] (or [kW]) is obtained as the product of the refrigeration effect Wr [kJ/kg] and a coolant circulation amount Qmr [kg/s] as in the following equation.

$$\phi 0 = Qmr \times Wr = Qmr \times (h1-h4)$$

Each of Wr, h1 and h4 is defined as follows.
Wr: Refrigeration effect [kJ/kg]
h1: Specific enthalpy of coolant (superheated vapor) at outlet of evaporation chamber VP [kJ/kg]

h4: Specific enthalpy of coolant (wet vapor) at inlet of evaporation chamber VP [kJ/kg]

A capacity of the temperature adjustment system CS to cool the cooling target object is called the refrigeration capacity. Therefore, the refrigeration capacity is proportional to the refrigeration effect of the coolant and the coolant circulation amount. Also, even if the evaporation chamber VP is divided into the divided chambers VP-1 to VP-n, the coolant circulation amount can be adjusted, and, thus, the refrigeration capacity of the divided chambers VP-1 to VP-n can be controlled.

The temperature adjustment system CS performs heat exchange in the evaporation chamber VP by circulating the coolant in the above-described refrigeration cycle shown in FIG. 4 and FIG. 5. The refrigeration cycle shown in FIG. 4 and FIG. 5 is implemented not only in the temperature adjustment system CS shown in FIG. 1 but also in temperature adjustment systems CS of other exemplary experimental examples 1 and 2, respectively, described below.

Further, the refrigeration capacity $\phi 0$ of the temperature adjustment system CS is proportional to the coolant circulation amount Qmr. Therefore, in the process PF3, the temperatures of the plurality of regions ER can be adjusted by adjusting the flow rates of the coolant supplied to the plurality of heat exchange chambers HR, respectively.

Furthermore, as the dryness fraction of the coolant increases, the specific enthalpy h4 of the coolant (wet vapor) at the inlet of the evaporation chamber VP increases, the refrigeration effect Wr decreases and the refrigeration capacity $\phi 0$ of the entire temperature adjustment system CS decreases. For this reason, when the temperature of the placing table PD is increased in the process PF2 and the process PF4, it is effective to increase the dryness fraction of the coolant.

The evaporation chamber VP and the retention chamber RT of the temperature adjustment system CS will be described in more detail with reference to FIG. 1. The evaporation chamber VP of the temperature adjustment system CS includes a plurality of first divided chambers (divided chambers VP-1 to VP-n). The divided chambers VP-1 to VP-n are separated from each other inside the second plate 18b of the placing table PD. The first divided chambers (divided chambers VP-1 to VP-n) include the discharge holes JO and are disposed in a scattered manner across the placing surface FA when viewed from above the placing surface FA.

The retention chamber RT of the temperature adjustment system CS includes a plurality of second divided chambers (divided chambers RT-1 to RT-n). The divided chambers RT-1 to RT-n are separated from each other inside the first plate 18a of the placing table PD. The second divided chambers (divided chambers RT-1 to RT-n) communicate with the first divided chambers via the pipes PP, respectively.

The discharge line DLd includes a plurality of first branch lines (branch lines DLd-1 to DLd-n). The branch lines DLd-1 to DLd-n are connected to the respective divided chambers VP-1 to VP-n of the evaporation chamber VP.

The supply line SL includes a plurality of second branch lines (branch lines SL-1 to SL-n). One end of the supply line SL is connected to the condensing device CD of the chiller unit CH. The branch lines SL-1 to SL-n are disposed at the other end of the supply line SL. That is, the supply line SL extending from the chiller unit CH is branched into the branch lines SL-1 to SL-n. The branch lines SL-1 to SL-n are connected to the respective divided chambers RT-1 to RT-n of the retention chamber RT.

The chiller unit CH includes the pressure gauge PRC and the expansion valve EVC. The pressure gauge PRC and the expansion valve EVC are disposed on the supply line SL. The expansion valve EVC is disposed between the condensing device CD and the pressure gauge PRC on the supply line SL.

The chiller unit CH includes a plurality of pressure gauges PRLd (pressure gauges PRLd-1 to PRLd-n) and a plurality of check valves CVLd (check valves CVLd-1 to CVLd-n). The chiller unit CH also includes a plurality of expansion valves EVLd (expansion valves EVLd-1 to EVLd-n), a plurality of adjustment valves AV (adjustment valves AVd-1 to AVd-n) and a plurality of compressors CM (compressors CMd-1 to CMd-n).

The compressors CMd-1 to CMd-n are disposed in the respective branch lines DLd-1 to DLd-n. The adjustment valves AVd-1 to AVd-n are disposed in the respective branch lines DLd-1 to DLd-n.

The expansion valves EVLd-1 to EVLd-n are disposed in the respective branch lines DLd-1 to DLd-n. The check valves CVLd-1 to CVLd-n are disposed in the respective branch lines DLd-1 to DLd-n. The pressure gauges PRLd-1 to PRLd-n are disposed in the respective branch lines DLd-1 to DLd-n.

The condensing device CD is connected to each of the compressors CMd-1 to CMd-n. The compressors CMd-1 to CMd-n are connected to the respective adjustment valves AVd-1 to AVd-n. The adjustment valves AVd-1 to AVd-n are connected to the respective expansion valves EVLd-1 to EVLd-n.

The expansion valves EVLd-1 to EVLd-n are connected to the respective check valves CVLd-1 to CVLd-n. The check valves CVLd-1 to CVLd-n are connected to the respective pressure gauges PRLd-1 to PRLd-n. The pressure gauges PRLd-1 to PRLd-n are connected to the respective divided chambers VP-1 to VP-n.

The pressure gauge PRC of the chiller unit CH is connected to the flow rate control valve FCV on the supply line SL. The flow rate control valve FCV is connected to the chiller unit CH and the branch lines SL-1 to SL-n. The flow rate control valve FCV is disposed between the chiller unit CH and the branch lines SL-1 to SL-n on the supply line SL.

A flow rate control valve (each of the flow rate control valves FCV-1 to FCV-n) and a pressure gauge (each of the pressure gauges PRC-1 to PRC-n) are disposed in each of the branch lines SL-1 to SL-n. For example, the flow rate control valve FCV-1 and the pressure gauge PRC-1 are disposed on the branch line SL-1, and the flow rate control valve FCV-n and the pressure gauge PRC-n are disposed on the branch line SL-n.

Each of the flow rate control valves FCV-1 to FCV-n is connected to the flow rate control valve FCV. The pressure gauges PRC-1 to PRC-n are connected to the respective flow rate control valves FCV-1 to FCV-n. The divided chambers RT-1 to RT-n are connected to the respective pressure gauges PRC-1 to PRC-n.

The flow rate control valves FCV-1 to FCV-n are disposed between the flow rate control valve FCV and the respective pressure gauges PRC-1 to PRC-n. The pressure gauges PRC-1 to PRC-n are disposed between the flow rate control valves FCV-1 to FCV-n and the divided chambers RT-1 to RT-n, respectively.

The flow rate of the coolant output from the chiller unit CH to the evaporation chamber VP (each of the divided chambers VP-1 to VP-n) through the supply line SL is first adjusted collectively by adjusting the opening degree [%] of the flow rate control valve FCV. Thereafter, the flow rates in the branch lines SL-1 to SL-n (the flow rates of the coolant supplied to the divided chambers RT-1 to RT-n) are adjusted individually by adjusting the opening degrees [%] of the flow rate control valves FCV-1 to FCV-n, respectively.

The opening degree [%] of each of the flow rate control valve FCV, the flow rate control valves FCV-1 to FCV-n and the adjustment valves AVd-1 to AVd-n is controlled by the control device Cnt. The opening degree [%] of each of the expansion valves EVLd-1 to EVLd-n and the check valves CVLd-1 to CVLd-n is controlled by the control device Cnt.

Figure 7:
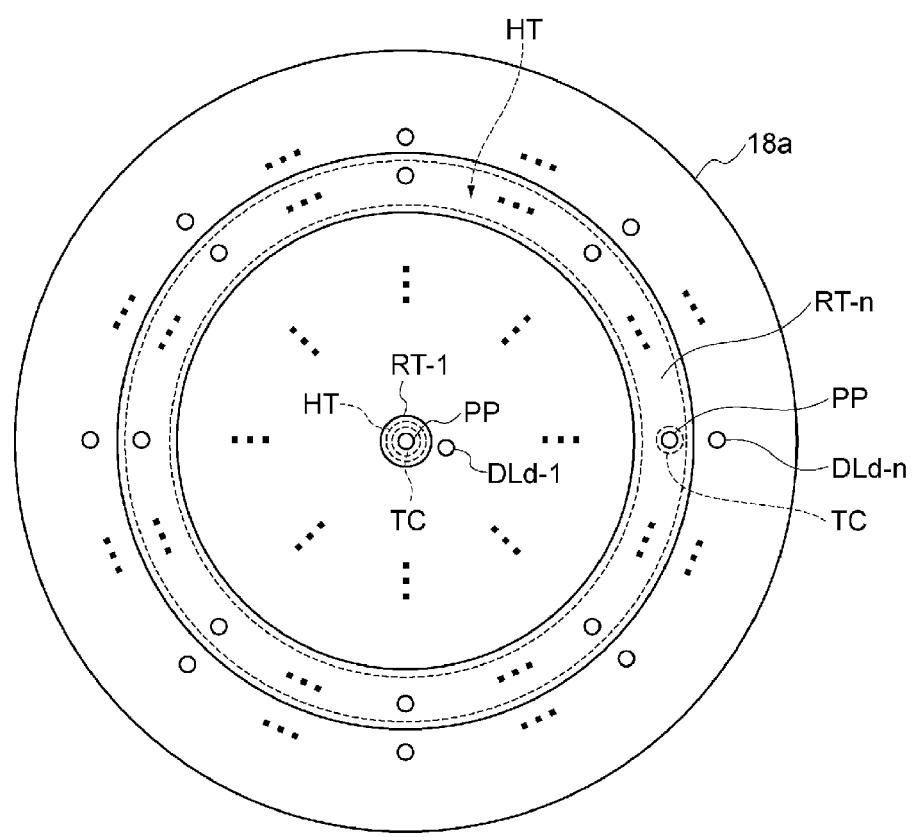
FIG. 7 is a diagram illustrating an example of a cross section of a lower electrode along line X1-X1 shown in FIG. 1.
Figure 8:
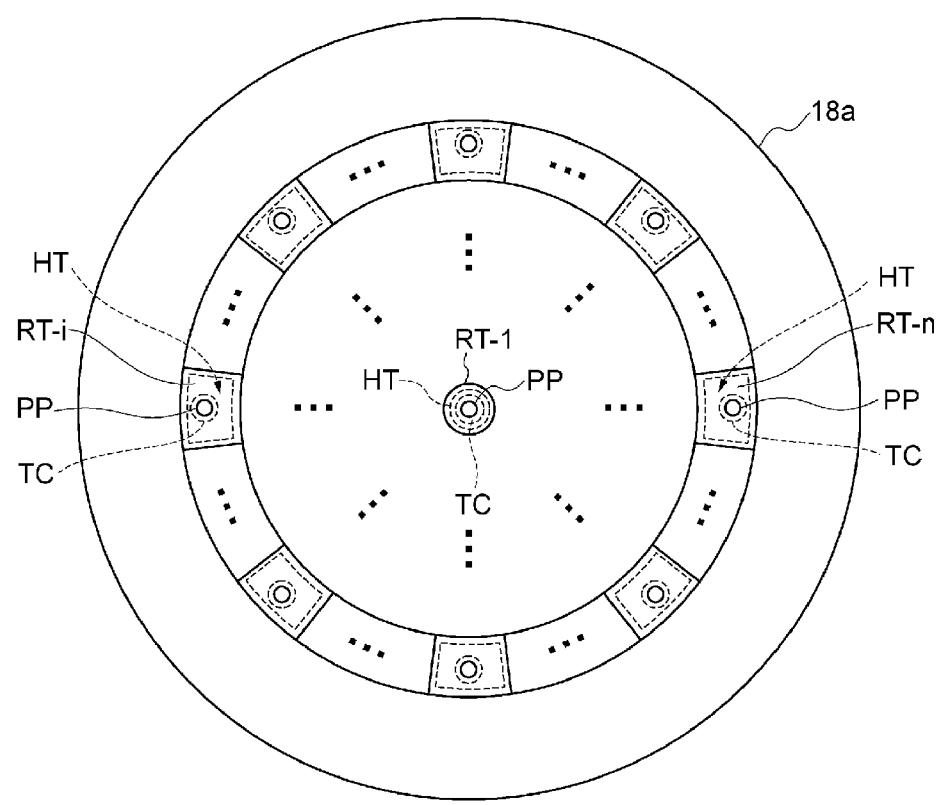
FIG. 8 is a diagram illustrating another example of the cross section of the lower electrode along line X1-X1 shown in FIG. 1.

FIG. 7 is a diagram illustrating an example of a cross section of a lower electrode LE along line X1-X1 shown in FIG. 1. FIG. 8 is a diagram illustrating another example of the cross section of the lower electrode LE along line X1-X1 shown in FIG. 1.

As shown in FIG. 7, the divided chambers RT-1 to RT-n are separated from each other. In the cross section shown in FIG. 7, the divided chambers RT-1 to RT-n are disposed in order in a diametrical direction toward an outer periphery from the center of a circular cross section of the first plate 18a when viewed from above the placing surface FA. In the cross section shown in FIG. 7, the divided chamber RT-1 has a circular cross section and the divided chamber (for example, the divided chamber RT-n) outside the divided chamber RT-1 has a band-like cross section when viewed from above the placing surface FA.

As shown in FIG. 7, the plurality of pipes PP (i.e., the plurality of discharge holes JO) is disposed in a scattered manner inside the placing surface FA when viewed from above the placing surface FA. As shown in FIG. 7, the discharge line DLd (the branch lines DLd-1 to DLd-n) connected to the divided chamber (the divided chambers VP-1 to VP-n) communicating with the pipe PP is disposed in the vicinity of each of the plurality of pipes PP.

The divided chamber outside the divided chamber RT-1 (for example, the divided chambers RT-i and RT-n, where i is an integer in the range of 1<i<N) has, but is not limited to, a band-like cross section shown in FIG. 7. For example, the divided chamber may have a cross section in which the band-like cross section is further divided into a plurality of sections in a circumferential direction and separated from each other as shown in FIG. 8.

FIG. 9 is a diagram for illustratively describing an operation of the temperature adjustment system CS shown in FIG. 1. The operation (operations PT1 to PT3) shown in FIG. 9 may also be applied to the temperature adjustment system CS (exemplary experimental example 1 and exemplary experimental example 2) shown in each of FIG. 10 and FIG. 12 described below.

The operation shown in FIG. 9 may be controlled by the control device Cnt. The operation shown in FIG. 9 is an operation of each of the flow rate control valves FCV-1 to FCV-n and is an operation of changing the opening degree [%] of each of the flow rate control valves FCV-1 to FCV-n in response to an elapse of a period such as a period T1 or a period T2. For example, the period T2 is a period subsequent to the period T1. In each period such as the period T1, the sum of the opening degrees [%] of the flow rate control valves FCV-1 to FCV-n is equal to 100[%].

The operation PT1 is an operation of suitably changing the opening degrees [%] of the flow rate control valves FCV-1 to FCV-n in response to an elapse of a period such as the period T1 or the period T2. In the operation PT1, for example, the opening degree [%] of the flow rate control valve FCV-1 may be set to 30[%] and the opening degree [%] of the flow rate control valve FCV-n may be set to 10[%] in the period T1. From this state, in the period T2 subsequent to the period T1, the opening degree [%] of the flow rate control valve FCV-1 is changed to 20[%] and the opening degree [%] of the flow rate control valve FCV-n is changed to 5[%].

The operation PT2 is an operation of fixing the opening degree [%] of each of the flow rate control valves FCV-1 to FCV-n in all periods (period T1 and the like). In the operation PT2, for example, the opening degree [%] of the flow rate control valve FCV-1 is fixed to 50[%] and the opening degree [%] of the flow rate control valve FCV-n is fixed to 20[%] in all periods (period T1 and the like). By fixing the opening degree of each flow rate control valve and adjusting the coolant circulation amount as described above, the refrigeration capacity of each divided chamber can be controlled as required even in a case where the heat input during the plasma processing is not uniform. The operation PT2 is a specific example of the operation PT1.

An operation PT3 is an operation of setting only any one of the flow rate control valves FCV-1 to FCV-n to an opening degree of 100[%] for each period such as the period T1 or the period T2. In the operation PT3, for example, in the period T1, the opening degree [%] of the flow rate control valve FCV-1 is set to 100[%] and in the period T2 subsequent to the period T1, the opening degree [%] of the flow rate control valve FCV-n is set to 100[%]. By adjusting the period of time for supplying the coolant to a divided chamber whose temperature is to be adjusted as described above, the refrigeration capacity of each divided chamber can be controlled as required even in a case where the heat input during the plasma processing is not uniform. The operation PT3 is a specific example of the operation PT1.

Exemplary Experimental Example 1

FIG. 10 is a diagram illustrating another configuration of the temperature adjustment system CS according to an exemplary embodiment of the present disclosure. The temperature adjustment system CS according to the present exemplary experimental example 1 has a configuration in which the discharge line DLu is added to the configuration shown in FIG. 1. The discharge line DLu according to the present exemplary experimental example 1 includes branch lines DLu-1 to DLu-n.

The branch lines DLu-1 to DLu-n are connected to the respective divided chambers VP-1 to VP-n. Check valves CVLu-1 to CVLu-n are disposed in the respective branch lines DLu-1 to DLu-n.

The check valves CVLu-1 to CVLu-n may be disposed inside the first plate 18a or may be disposed outside the lower electrode LE. The opening degree [%] of each of the check valves CVLu-1 to CVLu-n is controlled by the control device Cnt.

The divided chambers VP-1 to VP-n are connected to a retention chamber RK disposed in the first plate 18a via the respective branch lines DLu-1 to DLu-n, and the retention chamber RK is connected to the chiller unit CH via the discharge line DLu. The discharge line DLu (including the branch lines DLu-1 to DLu-n) is connected, via the retention chamber RK, to each of the divided chambers VP-1 to VP-n and the chiller unit CH according to the present exemplary experimental example 1.

The coolant discharged from the divided chambers VP-1 to VP-n is retained in the retention chamber RK through the respective branch lines DLu-1 to DLu-n. The coolant retained in the retention chamber RK is sent from the retention chamber RK to the chiller unit CH through the discharge line DLu connected to the retention chamber RK.

The chiller unit CH according to the present exemplary experimental example 1 further includes a pressure gauge PRLu, a check valve CVLu, an expansion valve EVLu, an adjustment valve AVu and the compressor CMu which are connected to the discharge line DLu.

The condensing device CD according to the present exemplary experimental example 1 is connected to the compressor CMu. The compressor CMu is connected to the adjustment valve AVu. The adjustment valve AVu is connected to the expansion valve EVLu. The expansion valve EVLu is connected to the check valve CVLu. The check valve CVLu is connected to the pressure gauge PRLu. The pressure gauge PRLu is connected to the retention chamber RK.

The function of the pressure gauge PRLu is the same as that of each of the pressure gauges PRLd-1 to PRLd-n. The function of the check valve CVLu is the same as that of each of the check valves CVLd-1 to CVLd-n. The function of the expansion valve EVLu is the same as that of each of the expansion valves EVLd-1 to EVLd-n. The function of the adjustment valve AVu is the same as that of each of the adjustment valves AVd-1 to AVd-n. The function of the compressor CMu is the same as that of each of the compressors CMd-1 to CMd-n.

The opening degree [%] of each of the adjustment valve AVu, the expansion valve EVLu and the check valve CVLu is controlled by the control device Cnt.

Figure 11:
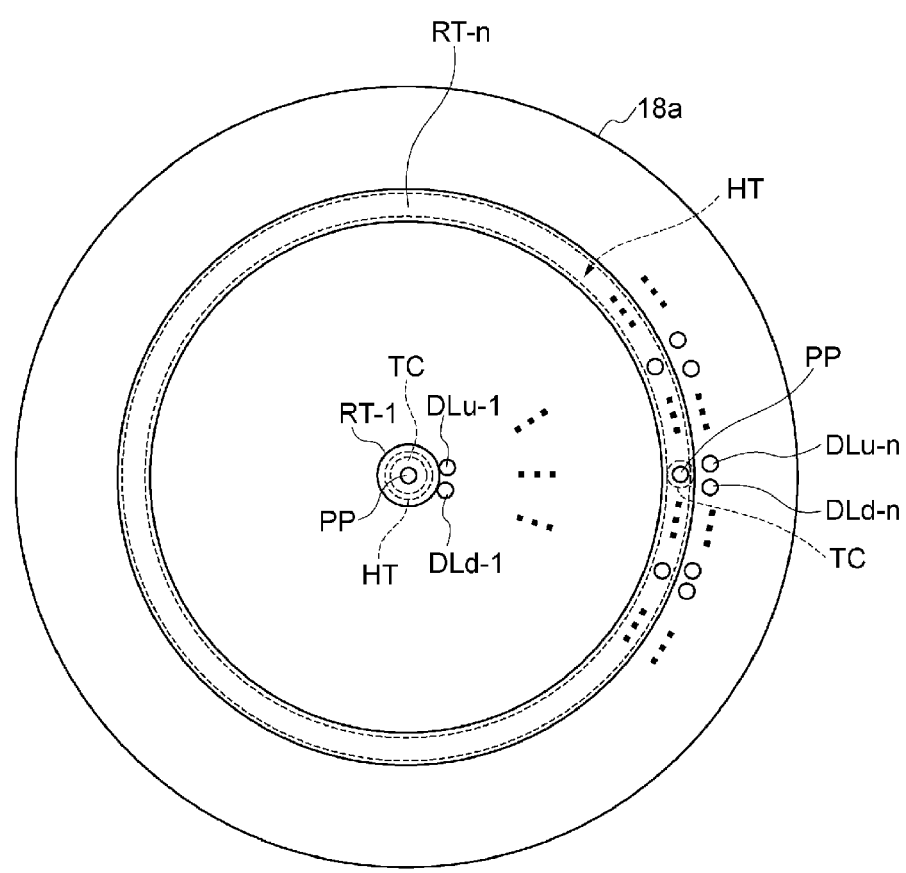
FIG. 11 is a diagram illustrating an example of a cross section of the lower electrode along line X2-X2 shown in FIG. 10.

FIG. 11 is a diagram illustrating an example of a cross section of the lower electrode LE along line X2-X2 shown in FIG. 10. As shown in FIG. 11, the shapes and arrangements of the divided chambers RT-1 to RT-n, the arrangement of the pipes PP and the arrangement of the branch lines DLd-1 to DLd-n in the present exemplary experimental example 1 are the same as in the case shown in FIG. 7.

As shown in FIG. 11, in the present exemplary experimental example 1, the discharge line DLu (the branch lines DLu-1 to DLu-n) connected to the divided chamber (the divided chambers VP-1 to VP-n) communicating with the pipe PP is disposed in the vicinity of each of the plurality of pipes PP.

Exemplary Experimental Example 2

FIG. 12 is a diagram illustrating another configuration of the temperature adjustment system CS according to an exemplary embodiment of the present disclosure. The temperature adjustment system CS according to the exemplary experimental example 2 includes a plurality of chiller units (chiller units CH-1 to CH-n). The plurality of chiller units circulates the coolant with respect to the plurality of heat exchange chambers HR, respectively, in an independent manner. In the process PF4, cooling of the plurality of regions ER is performed by circulating the coolant with respect to the plurality of heat exchange chambers HR, respectively, in an independent manner.

Each of the chiller units CH-1 to CH-n has the same function as the chiller unit CH having the configuration shown in FIG. 1. In particular, each of the chiller units CH-1 to CH-n supplies and discharges the coolant to and from a pair of a second divided chamber and a first divided chamber communicating with each other. For example, the chiller unit CH-1 supplies and discharges the coolant to and from the divided chamber RT-1 and the divided chamber VP-1 connected to the chiller unit CH-1.

The chiller units CH-1 to CH-n include the respective condensing devices CD-1 to CD-n. Each of the condensing devices CD-1 to CD-n according to the present exemplary experimental example 2 has the same function as the condensing device CD shown in each of FIG. 1 and FIG. 10.

The branch lines SL-1 to SL-n are connected to the respective divided chambers RT-1 to RT-n and the respective condensing devices CD-1 to CD-n. For example, the branch line SL-1 connects the divided chamber RT-1 and the condensing device CD-1 of the chiller unit CH-1.

The branch lines DLd-1 to DLd-n are connected to the respective divided chambers VP-1 to VP-n and the respective condensing devices CD-1 to CD-n. For example, the branch line DLd-1 connects the divided chamber VP-1 and the condensing device CD-1 of the chiller unit CH-1.

Each of the chiller units CH-1 to CH-n includes the expansion valve EVC and the pressure gauge PRC.

The chiller units CH-1 to CH-n include the compressors CMd-1 to CMd-n and the adjustment valves AVd-1 to AVd-n, respectively.

The chiller units CH-1 to CH-n include the expansion valves EVLd-1 to EVLd-n, the check valves CVLd-1 to CVLd-n and the pressure gauges PRLd-1 to PRLd-n, respectively.

The condensing devices CD-1 to CD-n are connected to the expansion valve EVC and the respective compressors CMd-1 to CMd-n.

The temperature adjustment system CS according to the present exemplary experimental example 2 includes the flow rate control valves FCV-1 to FCV-n and the pressure gauges PRC-1 to PRC-n, similarly to the configuration shown in FIG. 1. The flow rate control valves FCV-1 to FCV-n are disposed in the respective branch lines SL-1 to SL-n. The pressure gauges PRC-1 to PRC-n are disposed in the respective branch lines SL-1 to SL-n.

The flow rate control valves FCV-1 to FCV-n are disposed between the chiller units CH-1 to CH-n and the pressure gauges PRC-1 to PRC-n, respectively. The pressure gauges PRC-1 to PRC-n are disposed between the flow rate control valves FCV-1 to FCV-n and the divided chambers RT-1 to RT-n, respectively.

The flow rates of the coolant supplied from the chiller units CH-1 to CH-n to the divided chambers RT-1 to RT-n can be adjusted by adjusting the opening degrees [%] of the flow rate control valves FCV-1 to FCV-n, respectively.

Figure 13:
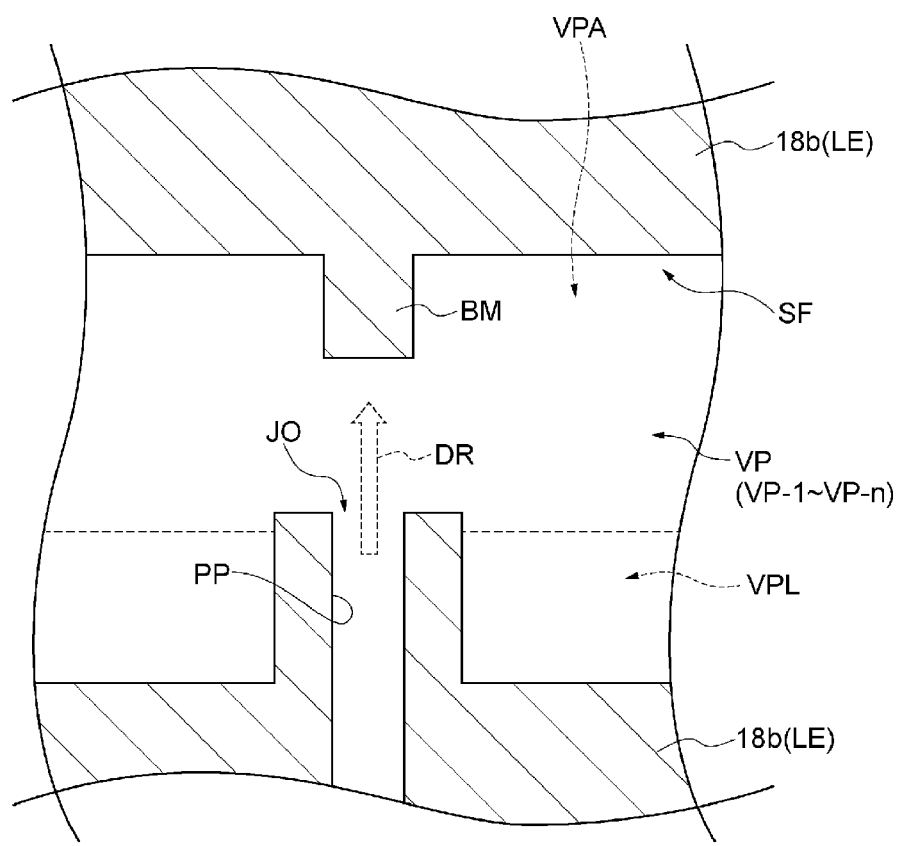
FIG. 13 is a diagram illustrating a main configuration of an evaporation chamber included in the temperature adjustment system shown in each of FIG. 1, FIG. 10 and FIG. 12.

FIG. 13 is a diagram illustrating a main configuration of the evaporation chamber VP (or the divided chambers VP-1 to VP-n) included in the temperature adjustment system CS shown in each of FIG. 1, FIG. 10 and FIG. 12. A plurality of protrusions BM is disposed on the heat transfer wall SF of the evaporation chamber VP. A protrusion BM is disposed on the heat transfer wall SF of each of the divided chambers VP-1 to VP-n. The protrusion BM is integrated with the heat transfer wall SF and has relatively high thermal conductivity like the heat transfer wall SF.

The protrusion BM is arranged such that the discharge hole JO of the pipe PP faces the protrusion BM. The coolant is discharged in a discharging direction DR from the discharge hole JO and sprayed onto the protrusion BM. The coolant sprayed on the protrusion BM may receive heat from the protrusion BM and the heat transfer wall SF. Since the heat of the protrusion BM and the heat transfer wall SF moves to the coolant due to the coolant sprayed on the protrusion BM, heat may be removed from the placing surface FA due to the coolant.

The present disclosure is not limited to a case where the protrusion BM is disposed on the heat transfer wall SF. For example, when columnar fins (each having a diameter of 1.0 to 5.0 [mm] and a height of 1.0 to 5.0 [mm]) are disposed on the heat transfer wall SF, it is possible to achieve the same effect as the case where the protrusion BM is used.

Alternatively, dimples (each having a diameter of 1.0 to 5.0 [mm] and a depth of 1.0 to 5.0 [mm]) may be disposed on the heat transfer wall SF. Otherwise, the surface roughness of the heat transfer wall SF may be increased (surface roughness having Ra of 6.3 [μm] and Rz of 25 [μm]), or porous surface treatment may be applied to the surface of the heat transfer wall SF by thermal spraying or the like.

When the columnar fins are disposed on the heat transfer wall SF and when the dimples are disposed on the heat transfer wall SF, particularly, a portion onto which the coolant is sprayed is more narrowly (more finely) formed compared to when the protrusions BM are disposed. Therefore, the spatial resolution is improved. When the surface roughness of the heat transfer wall SF is increased and when porous surface treatment is applied to the surface of the heat transfer wall SF by thermal spraying or the like, particularly, the surface area of the portion onto which the coolant is sprayed increases compared to when the protrusions BM are disposed. Therefore, the thermal conductivity is improved.

According to the configuration of the temperature adjustment system CS, the plurality of discharge holes JO for discharging the coolant onto the heat transfer wall SF of the heat exchange unit HE is disposed in a scattered manner inside the placing surface FA when viewed from above the placing surface FA. Therefore, when viewed from above the placing surface FA, the coolant can be evenly sprayed on the heat transfer wall SF regardless of the location. For this reason, it is possible to reduce the non-uniformity in heat removal from each place of the wafer W placed on the placing surface FA.

The discharge line DLd (including the branch lines DLd-1 to DLd-n) is connected to the liquid accumulation region VPL extending below the discharge hole JO in the evaporation chamber VP (including the divided chambers VP-1 to VP-n). Therefore, the coolant accumulated on the bottom wall SFa can be efficiently recovered.

In addition, the vaporized coolant has a decrease in thermal conductivity and thus hardly contributes to heat exchange. Thus, if the coolant stays in a stagnant state, it becomes a hindrance to heat exchange. Therefore, it is desirable to quickly discharge the vaporized coolant. Therefore, the discharge line DLu is disposed in the gas diffusion region VPA extending above the discharge hole JO in the evaporation chamber VP (including the divided chambers VP-1 to VP-n). Accordingly, the vapor of the coolant present around the heat transfer wall SF can be quickly recovered.

Further, when each of the evaporation chamber VP and the retention chamber RT is divided into a plurality of divided chambers (the divided chambers VP-1 to VP-n and the divided chambers RT-1 to RT-n) separated from each other, the plurality of divided chambers is disposed in a scattered manner inside the placing surface FA when viewed from above the placing surface FA. Therefore, it is possible to further reduce the non-uniformity in heat removal from each place of the wafer W placed on the placing surface FA.

Furthermore, when the retention chamber RT is divided into a plurality of divided chambers RT-1 to RT-n separated from each other, the flow rate of the coolant supplied to each divided chamber can be adjusted. Therefore, it is possible to finely control heat removal from each place of the wafer W and thus possible to further reduce the non-uniformity in heat removal from each place of the wafer W.

Also, the chiller units CH-1 to CH-n are disposed in the divided chambers RT-1 to RT-n, respectively, of the retention chamber RT. The circulation of the coolant may be independently performed by each of the chiller units CH-1 to CH-n. Therefore, it is possible to more finely control the heat removal from each place of the wafer W.

Although the principle of the present disclosure has been illustrated and described in the preferred exemplary embodiments, it will be appreciated by those skilled in the art that the present disclosure may be modified in arrangement and details without departing from such a principle. The present disclosure is not limited to the specific configuration disclosed in the exemplary embodiments. Accordingly, all modifications and changes caused within the scope of the claims and the spirit thereof are claimed.

With the temperature adjustment system according to one exemplary embodiment, it is possible to reduce the non-uniformity in temperature of the placing table on which the target object is placed.

We claim:

1. A temperature adjustment system, comprising:
a heat exchange unit;
a chiller device;
a heating device;
a temperature detection device; and
a control device,
wherein the heat exchange unit is configured to perform heat exchange using a coolant and is disposed inside a placing table, on which a target object is placed, and equipped with multiple heat exchange chambers,
the multiple heat exchange chambers are disposed in multiple regions, respectively, set on the placing table,
the multiple regions are set along a placing surface of the placing table,
the chiller device is configured to circulate the coolant with respect to the multiple heat exchange chambers,
the temperature detection device includes multiple temperature detectors,
the multiple temperature detectors are disposed in the multiple regions, respectively, and disposed between the respective multiple heat exchange chambers and the placing surface, and
the control device is configured to control the chiller device to adjust a pressure of the coolant such that a temperature of the placing table reaches a first temperature range, and then, control the chiller device to individually adjust flow rates of the coolant supplied to the multiple heat exchange chambers, respectively, such that all of temperatures measured by the multiple temperature detectors reach the first temperature range.

2. The temperature adjustment system of claim 1, wherein after all of the temperatures measured by the multiple temperature detectors reach the first temperature range, the control device controls the chiller device to adjust the pressure of the coolant such that the temperature of the placing table reaches a second temperature range different from the first temperature range.

3. The temperature adjustment system of claim 1, wherein the heating device includes multiple heaters,
the multiple heaters are disposed in the multiple regions, respectively, and disposed between the respective multiple heat exchange chambers and the placing surface, and
when the pressure of the coolant is adjusted, the control device further performs, based on the temperatures measured by the temperature detectors, at least one of adjustment of heat generation amount from each of the multiple heaters by controlling each of the multiple heaters or adjustment of dryness fraction of the coolant by controlling the chiller device.

4. The temperature adjustment system of claim 1, wherein the heating device includes multiple heaters, the multiple heaters are disposed in the multiple regions, respectively, and disposed between the respective multiple heat exchange chambers and the placing surface, and when the flow rates of the coolant are adjusted, the control device further adjusts heat generation amount from each heater by controlling the corresponding heater based on the temperatures measured by the temperature detectors.

5. The temperature adjustment system of claim 1, wherein the chiller device includes multiple chiller units, and the multiple chiller units circulate the coolant with respect to the multiple heat exchange chambers, respectively.

6. The temperature adjustment system of claim 1, wherein the placing table is disposed inside a processing container of a plasma processing apparatus.

* * * * *